US009508449B2

(12) United States Patent
Yu et al.

(10) Patent No.: US 9,508,449 B2
(45) Date of Patent: Nov. 29, 2016

(54) LIQUID CRYSTAL DISPLAY AND BIDIRECTIONAL SHIFT REGISTER DEVICE THEREOF

(71) Applicant: Hannstar Display Corporation, New Taipei (TW)

(72) Inventors: Chia-Hua Yu, New Taipei (TW); Sung-Chun Lin, Tainan (TW); Hsuan-Chen Liu, Kaohsiung (TW); Chien-Ting Chan, Tainan (TW)

(73) Assignee: Hannstar Display Corporation, Taipei (TW)

( * ) Notice: Subject to any disclaimer, the term of this patent is extended or adjusted under 35 U.S.C. 154(b) by 205 days.

(21) Appl. No.: 14/151,842

(22) Filed: Jan. 10, 2014

(65) Prior Publication Data

US 2015/0109353 A1 Apr. 23, 2015

(30) Foreign Application Priority Data

Oct. 22, 2013 (CN) .......................... 2013 1 0499380

(51) Int. Cl.
*G11C 19/00* (2006.01)
*G11C 19/28* (2006.01)
*G09G 3/36* (2006.01)

(52) U.S. Cl.
CPC ............. *G11C 19/28* (2013.01); *G09G 3/3677* (2013.01); *G09G 2300/0408* (2013.01); *G09G 2300/0413* (2013.01); *G09G 2310/0283* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 7,436,923 | B2 * | 10/2008 | Tobita | 377/64 |
| 7,929,658 | B2 * | 4/2011 | Lin et al. | 377/64 |
| 8,023,611 | B2 * | 9/2011 | Lin et al. | 377/64 |
| 8,633,888 | B2 * | 1/2014 | Kim et al. | 345/100 |
| 2006/0007085 | A1 * | 1/2006 | Kim et al. | 345/87 |
| 2007/0104307 | A1 * | 5/2007 | Kim et al. | 377/64 |
| 2007/0217564 | A1 * | 9/2007 | Tobita | 377/64 |
| 2012/0269316 | A1 * | 10/2012 | Jang et al. | 377/75 |
| 2012/0293467 | A1 * | 11/2012 | Lee et al. | 345/204 |
| 2013/0077736 | A1 * | 3/2013 | Son | 377/69 |
| 2014/0091997 | A1 * | 4/2014 | Han et al. | 345/92 |
| 2014/0253424 | A1 * | 9/2014 | Yu et al. | 345/100 |
| 2014/0354523 | A1 * | 12/2014 | So et al. | 345/100 |

FOREIGN PATENT DOCUMENTS

JP 2006024350 * 1/2006

* cited by examiner

*Primary Examiner* — Tuan T Lam
(74) *Attorney, Agent, or Firm* — Jianq Chyun IP Office

(57) ABSTRACT

A liquid crystal display and its bidirectional shift register device including N stages of shift registers are provided. An $i^{th}$ stage shift register of the shift registers includes a pre-charge unit, a pull-up unit and a pull-down unit. The pre-charge unit outputs a pre-charge signal according to outputs of $(i-2)^{th}$ and $(i+2)^{th}$ stage shift registers. The pull-up unit outputs a scan signal. A first discharge unit of the pull-down unit determines whether to pull the scan signal down to a reference voltage potential according to the pre-charge signal and a first voltage-dividing signal associated with a first level signal. A second discharge unit of the pull-down unit determines whether to pull the scan signal down to the reference voltage potential according to the pre-charge signal and a second voltage-dividing signal associated with a second level signal.

10 Claims, 13 Drawing Sheets

LIQUID CRYSTAL DISPLAY AND BIDIRECTIONAL SHIFT REGISTER DEVICE THEREOF

CROSS-REFERENCE TO RELATED APPLICATION

This application claims the priority benefit of China application serial no. 201310499380.3, filed on Oct. 22, 2013. The entirety of the above-mentioned patent application is hereby incorporated by reference herein and made a part of this specification.

BACKGROUND OF THE INVENTION

Field of the Invention

The invention relates to a flat panel display technique, and more particularly, to a liquid crystal display (LCD) and its bidirectional shift register device.

Description of Related Art

Due to the rapid advancement of semiconductor technologies in the recent years, portable electronics and flat panel displays have gained popularity. Among various types of flat panel displays, liquid crystal displays (LCDs) have gradually become the mainstream display products on account of the advantages including a low operating voltage, free of harmful radiation, light weight and small volume. As a consequence, the LCD has been developed by manufacturers in this field to comply with the requirements for miniature and low costs.

In order to lower down the manufacturing costs of the LCD, some manufacturers directly place shift registers on a glass substrate of the LCD panel in an amorphous silicon (a-Si) manufacturing process instead of placing the shift registers inside a scan driver IC on a scan side of the LCD panel. Thereby, the scan driver IC originally placed on the scan side of the LCD panel is no longer required, such that the manufacturing costs of the LCD can be reduced.

SUMMARY OF THE INVENTION

The invention is directed to a liquid crystal display (LCD) and its shift register device for improving the reliability of the bidirectional shift register device and reducing the circuit layout area of the bidirectional shift register device.

In an embodiment of the invention, a bidirectional shift register device that includes N stages of shift registers connected together in series is provided, and an $i^{th}$ stage shift register of the shift registers includes a pre-charge unit, a pull-up unit, and a pull-down unit. The pre-charge unit receives an output of an $(i-2)^{th}$ stage shift register and an output of an $(i+2)^{th}$ stage shift register of the shift registers and outputs a pre-charge signal according to the outputs of the $(i-2)^{th}$ and $(i+2)^{th}$ stage shift registers. Here, N is a predetermined positive integer, and i is a positive integer larger than or equal to 3 and smaller than or equal to N−2. The pull-up unit is coupled to the pre-charge unit, receives the pre-charge signal and a predetermined clock signal, and outputs a scan signal according to the pre-charge signal and the predetermined clock signal. The pull-down unit is coupled to the pre-charge unit and the pull-up unit and includes a first discharge unit and a second discharge unit. The first discharge unit receives the pre-charge signal and a first level signal and determines whether to pull the scan signal down to a reference voltage potential according to the pre-charge signal and a first voltage-dividing signal associated with the first level signal. The second discharge unit receives the pre-charge signal and a second level signal and determines whether to pull the scan signal down to the reference voltage potential according to the pre-charge signal and a second voltage-dividing signal associated with the second level signal.

In an embodiment of the invention, an LCD that includes an LCD panel, a driver circuit, and a backlight module is provided. The LCD panel includes a substrate, a plurality of pixels arranged in an array, a first bidirectional shift register device, and a second bidirectional shift register device, wherein the pixels, the first bidirectional shift register device, and the second bidirectional shift register device are located on the substrate. The first bidirectional shift register device has N stages of first shift registers connected together in series and corresponding to the pixels in odd rows, and an $i^{th}$ stage first shift register of the first shift registers includes a first pre-charge unit, a first pull-up unit, and a first pull-down unit. The first pre-charge unit receives an output of an $(i-2)^{th}$ stage first shift register and an output of an $(i+2)^{th}$ stage first shift register of the first shift registers and outputs a first pre-charge signal according to the outputs of the $(i-2)^{th}$ and $(i+2)^{th}$ stage first shift registers. Here, N is a predetermined positive integer, and i is a positive integer larger than or equal to 3 and smaller than or equal to N−2. The first pull-up unit is coupled to the first pre-charge unit, receives the first pre-charge signal and a first predetermined clock signal, and outputs a first scan signal according to the first pre-charge signal and the first predetermined clock signal. The first pull-down unit is coupled to the first pre-charge unit and the first pull-up unit and includes a first discharge unit and a second discharge unit. The first discharge unit receives the first pre-charge signal and a first level signal and determines whether to pull the first scan signal down to a reference voltage potential according to the first pre-charge signal and a first voltage-dividing signal associated with the first level signal. The second discharge unit receives the first pre-charge signal and a second level signal and determines whether to pull the second scan signal down to the reference voltage potential according to the first pre-charge signal and a second voltage-dividing signal associated with the second level signal. Here, a phase of the first level signal and a phase of the second level signal are inverse to each other. The second bidirectional shift register device has M stages of second shift registers connected together in series and corresponding to the pixels in even rows, and a $j^{th}$ stage second shift register of the second shift registers includes a second pre-charge unit, a second pull-up unit, and a second pull-down unit. The second pre-charge unit receives an output of a $(j-2)^{th}$ stage second shift register and an output of a $(j+2)^{th}$ stage second shift register of the second shift registers and outputs a second pre-charge signal according to the outputs of the $(j-2)^{th}$ and $(j+2)^{th}$ stage second shift registers. Here, M is a predetermined positive integer, and j is a positive integer larger than or equal to 3 and smaller than or equal to M−2. The second pull-up unit is coupled to the second pre-charge unit, receives the second pre-charge signal and a second predetermined clock signal, and outputs a second scan signal according to the second pre-charge signal and the second predetermined clock signal. The second pull-down unit is coupled to the second pre-charge unit and the second pull-up unit and includes a third discharge unit and a fourth discharge unit. The third discharge unit receives the second pre-charge signal and a third level signal and determines whether to pull the second scan signal down to a reference voltage potential according to the second pre-charge signal and a third voltage-dividing signal associated with the third level signal. The fourth discharge unit receives the second pre-charge signal and a fourth level signal and determines whether to pull the second scan signal down to the reference voltage potential according to the second pre-charge signal and a fourth voltage-dividing signal associated with the fourth level signal. Here, a phase of the third level signal and a phase of the fourth level signal are inverse to each other. The driver circuit is coupled to the LCD panel for driving the LCD panel to display an image, and the driver circuit provides a plurality of predetermined clock signals as the first predetermined clock signal and the second predetermined clock signal. The backlight module serves to provide a light source required by the LCD panel.

In view of the above, an embodiment of the invention provides an LCD and its bidirectional shift register device. The bidirectional shift register device is capable of discharging nodes by means of the pull-down unit having two discharge units, so as to stably control the level of the scan signal output by each shift register and further enhance the overall reliability of the bidirectional shift register device effectively. Additionally, according to the circuit configuration of the shift registers described herein, the operation of the discharge units may be controlled by means of the voltage-dividing signals within the discharge units, and thus the components bearing the high current load in the discharge units may have the reduced load. As a result, if the shift registers described in any of the embodiments of the invention are applied, relevant components in the bidirectional shift register device are less likely to be damaged, and the reliability of the bidirectional shift register device can be further improved.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
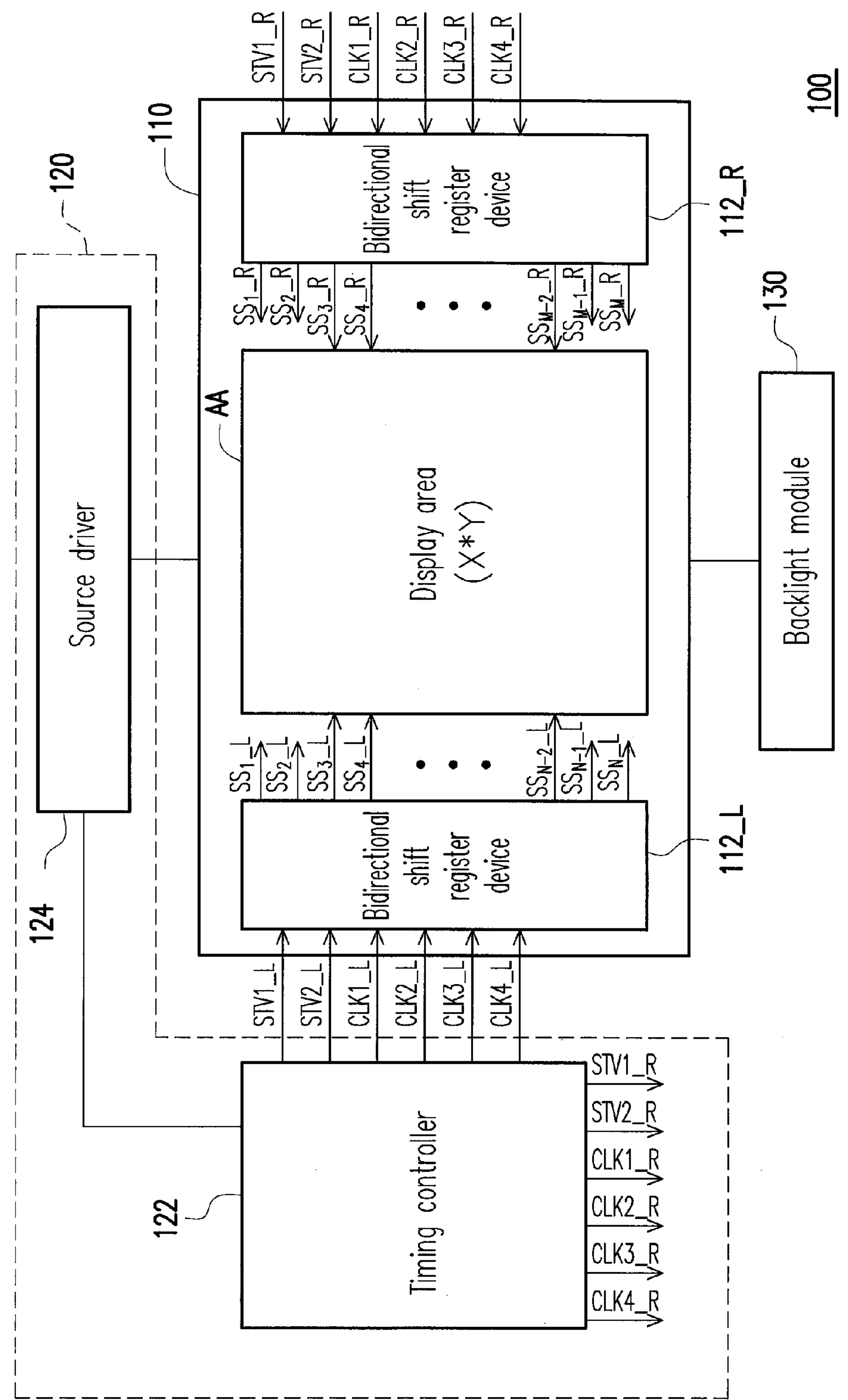
FIG. 1 is a schematic view illustrating a liquid crystal display (LCD) according to an embodiment of the invention.

Descriptions of the invention are given with reference to the exemplary embodiments illustrated with accompanied drawings, wherein same or similar parts are denoted with same reference numerals. Moreover, elements/components/notations with same reference numerals represent same or similar parts in the drawings and embodiments.

FIG. 1 is a schematic view illustrating a liquid crystal display (LCD) according to an embodiment of the invention. With reference to FIG. 1, the LCD 100 includes an LCD panel 110, a driver circuit 120, and a backlight module 130 configured to provide a (back) light source required by the LCD panel 110.

The LCD panel 110 includes a substrate (not shown, e.g., a glass substrate), a display area AA, and bidirectional shift register devices 112_L and 112_R. In the present exemplary embodiment, the display area AA of the LCD panel 110 has a plurality of pixels arranged in a matrix, which is represented by X*Y in FIG. 1. Here, both X and Y are positive integers. In general, X*Y (e.g., 1024*768) may also refer to the display resolution of the LCD panel 110, which should however not be construed as a limitation to the invention. The bidirectional shift register devices 112_L and 112_R are respectively located at two sides of the substrate of the LCD panel 110 and are respectively coupled to the pixels arranged in odd rows and in even rows through corresponding scan lines.

The driver circuit 120 includes a timing controller 122 and a source driver 124. In the driver circuit 120, the timing controller 122 is able to provide plural predetermined clock signals (e.g., clock signals STV1_L, STV2_L, STV1_R, STV2_R, CLK1_L to CLK4_L, and CLK1_R to CLK4_R) to control the operations of the bidirectional shift register devices 112_L and 112_R. The source driver 124 is also subject to the timing controller 122 and outputs a plurality of pixel voltages to drive the corresponding pixels in the LCD panel 110.

Particularly, the bidirectional shift register device 112_L is controlled by the timing controller 122 and outputs a plurality of scan signals $SS_1$_L to $SS_N$_L in response to the clock signals CLK1_L to CLK4_L and the start pulse signals STV1_L and STV2_L provided by the timing controller 122. The scan signals $SS_1$_L, $SS_2$_L, $SS_{N-1}$_L, and $SS_N$_L are dummy scan signals (not supplied to the LCD panel 110 and merely acting as the basis of generating other scan signals), whereas the scan signals $SS_3$_L to $SS_{N-2}$_L are provided to the pixels in odd rows in the LCD panel 110 through the corresponding scan lines, so as to sequentially turn on the pixels in odd rows. Here, N is a predetermined positive integer corresponding to the number of said odd rows. In the present embodiment, the bidirectional shift register device 112_L has four dummy shift registers, and therefore the value of N is obtained by adding four to the number of said odd rows.

Similarly, the bidirectional shift register device 112_R outputs a plurality of scan signals $SS_1$_R to $SS_M$_R in response to the clock signals CLK1_R to CLK4_R and the start pulse signals STV1_R and STV2_R provided by the timing controller 122. The scan signals $SS_1$_R, $SS_2$_R, $SS_{M-1}$_R, and $SS_M$_R are dummy scan signals, whereas the scan signals $SS_3$_R to $SS_{M-2}$_R are provided to the pixels in even rows in the LCD panel 110 through the corresponding scan lines, so as to sequentially turn on the pixels in even rows. Here, M is a predetermined positive integer corresponding to the number of said even rows. In the present embodiment, the bidirectional shift register device 112_R has four dummy shift registers, and therefore the value of M is obtained by adding four to the number of said even rows.

According to said driving manner, the pixels in each row in the LCD panel 110 are sequentially turned on according to the corresponding scan signals $SS_3$_L to $SS_{N-2}$_L and $SS_3$_R to $SS_{M-2}$_R. In the present embodiment, the timing controller 122 may control the scan order of the bidirectional shift register devices 112_L and 112_R by providing different predetermined clock signals, such that the bidirectional shift register devices 112_L and 112_R sequentially turn on the pixels in each row in the display area AA in a forward scan order (i.e., from the first row to the last row) or a reverse scan order (i.e., from the last row to the first row).

Figure 2A:
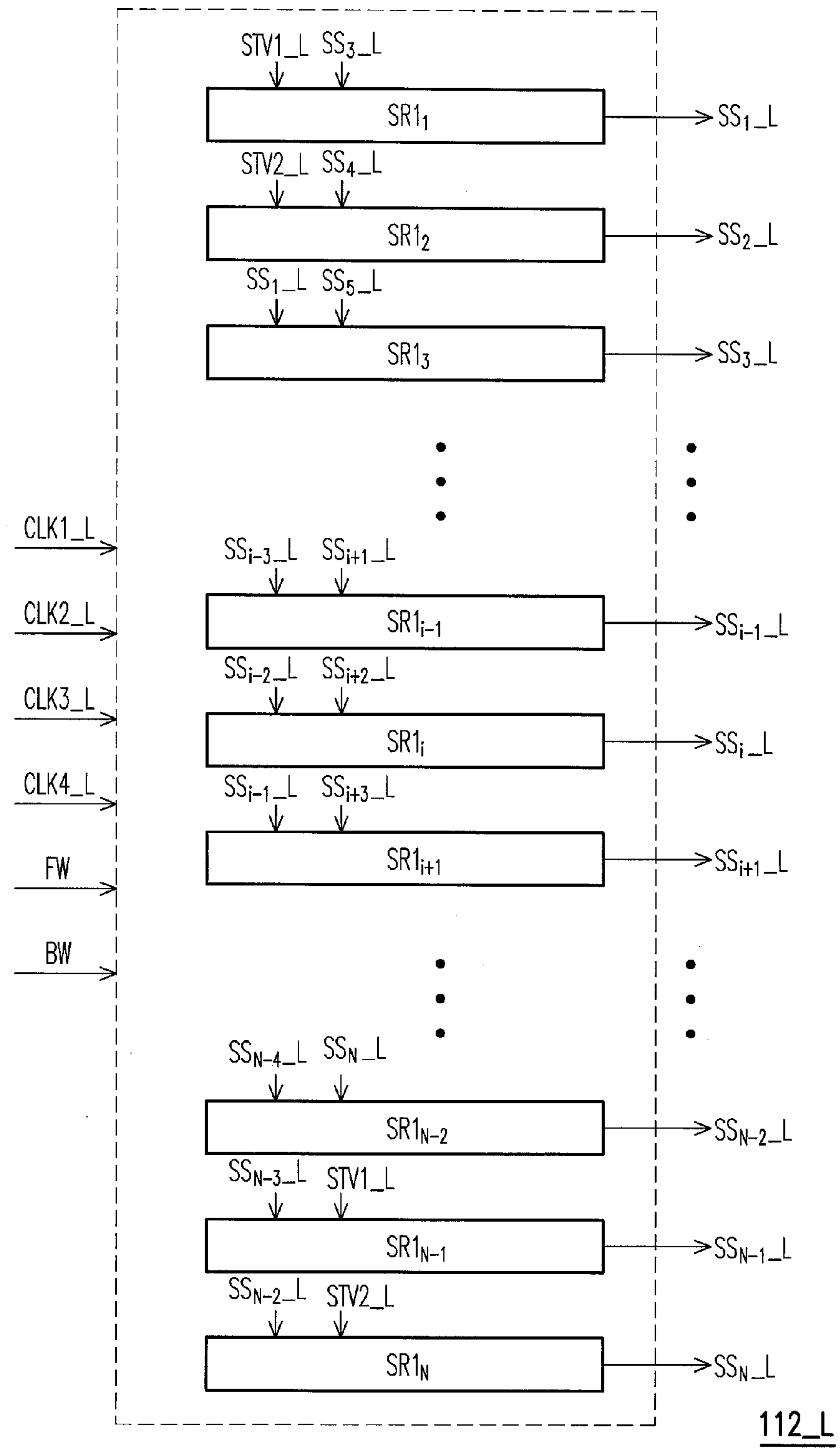
FIG. 2A and FIG. 2B are schematic views illustrating the bidirectional shift register devices according to the embodiment depicted in FIG. 1.
Figure 2B:
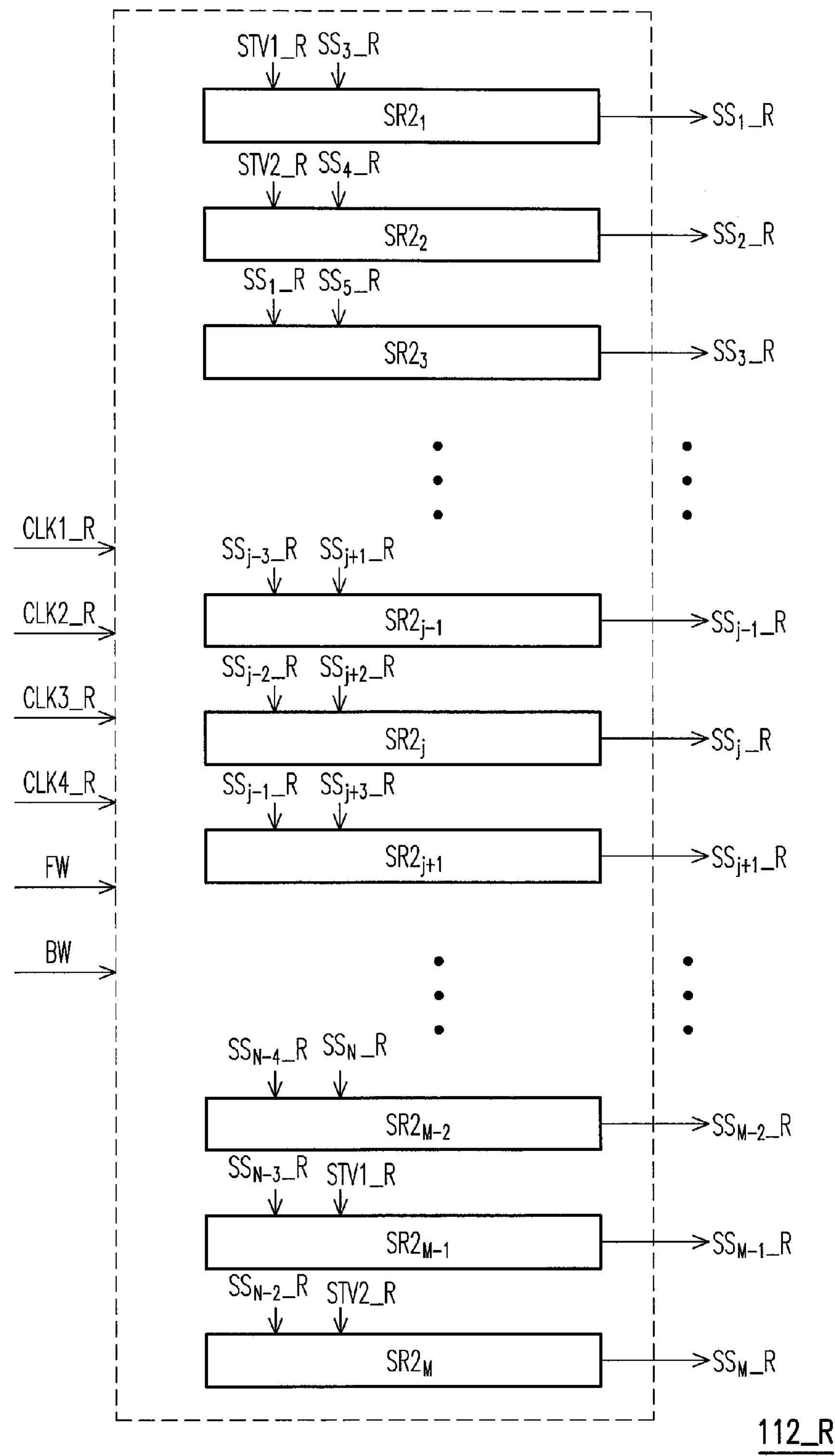

FIG. 2A and FIG. 2B are schematic views illustrating the bidirectional shift register devices 112_L and 112_R. With reference to FIG. 2A, the bidirectional shift register device 112_L includes N stages of shift registers $SR1_1$ to $SR1_N$ which are substantially the same and are connected together in series. Although circuit structures of the first stage shift register $SR1_1$, the second stage shift register $SR1_2$, the $(N-1)^{th}$ stage shift register $SR1_{N-1}$, and the $N^{th}$ stage shift register $SR1_N$ are the same as a circuit structure of the $i^{th}$ stage shift register $SR1i(3 \leq i \leq N-2)$, the first stage shift register $SR1_1$, the second stage shift register $SR1_2$, the $(N-1)^{th}$ stage shift register $SR1_{N-1}$, and the $N^{th}$ stage shift register $SR1_N$ are all dummy shift registers. That is, the scan signals $SS_1$_L, $SS_2$_L, $SS_{N-1}$_L, and $SS_N$_L respectively output by the first stage shift register $SR1_1$, the second stage shift register $SR1_2$, the $(N-1)^{th}$ stage shift register $SR1_{N-1}$, and the $N^{th}$ stage shift register $SR1_N$ merely serve to maintain the normal operation of the bidirectional shift register device 112_L rather than turning on the pixels in any row in the display area AA. Hence, the scan signals respectively output by the first stage shift register, the second stage shift register, the $(N-1)^{th}$ stage shift register, and the $N^{th}$ stage shift register may be considered as dummy scan signals, and the outputs $SS_3$_L to $SS_{N-2}$_L of the third stage shift register $SR1_3$ to the $(N-2)^{th}$ stage shift register $SR1_{N-2}$ serve to sequentially turn on the corresponding pixels in odd rows through the corresponding scan lines.

Similarly, with reference to FIG. 2B, the bidirectional shift register device 112_R includes M stages of shift registers $SR2_1$ to $SR2_M$ which are substantially the same and are connected together in series, and the first stage shift register $SR2_1$, the second stage shift register $SR2_2$, the $(M-1)^{th}$ stage shift register $SR2_{M-1}$, and the $M^{th}$ stage shift register $SR2_M$ are all dummy shift registers outputting dummy scan signals. By contrast, the outputs $SS_3$_R to $SS_{N-2}$_R of the third stage shift register $SR2_3$ to the $(M-2)^{th}$ stage shift register $SR2_{M-2}$ serve to sequentially turn on the corresponding pixels in even rows through the corresponding scan lines.

In the present embodiment, the bidirectional shift register devices 112_L and 112_R sequentially and respectively output the scan signals $SS_1$_L to $SS_N$_L and $SS_1$_R to $SS_M$_R in a forward scan order or a reverse scan order according to a forward input signal FW or a backward input signal BW. The forward input signal FW and the backward input signal BW may be provided by the timing controller 122 or by an additional signal generating unit, and the invention is not limited thereto.

In the following embodiments, the operational principles and the circuit structures of the shift registers $SR1_1$ to $SR1_N$ and $SR2_1$ to $SR2_M$ are substantially the same; therefore, the $i^{th}$ stage shift register $SR1i$ of the bidirectional shift register device 112_L is exemplified herein to elaborate the invention. People skilled in the art should be able to learn the operational principle and the circuit structure of the bidirectional shift register device 112_R and those of the shift registers $SR2_1$ to $SR2_M$ from the following descriptions, and therefore only the difference between the bidirectional shift register devices 112_L and 112_R will be provided hereinafter.

Figure 3A:
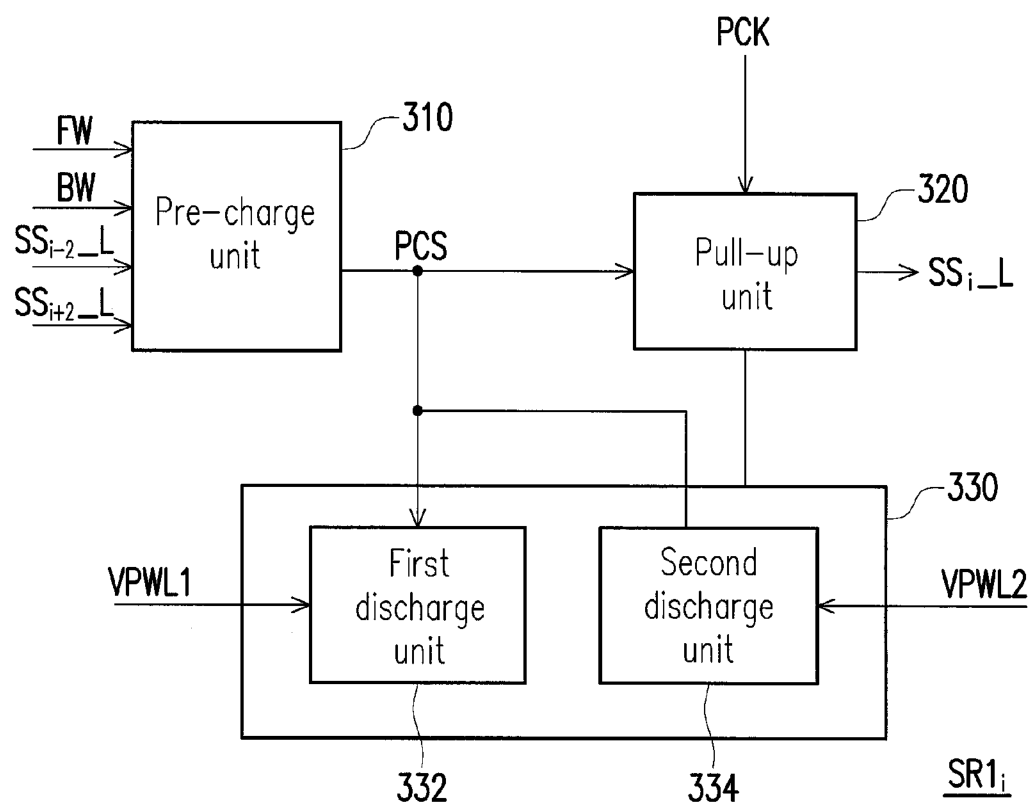
FIG. 3A is a schematic view illustrating shift registers according to the embodiment depicted in FIG. 2A.

FIG. 3A is a schematic view illustrating shift registers according to the embodiment depicted in FIG. 2A. With reference to FIG. 2A and FIG. 3A, the $i^{th}$ stage shift register $SR1_i$ includes a pre-charge unit 310, a pull-up unit 320 and a pull-down unit 330. The pre-charge unit 310 receives an output of the $(i-2)^{th}$ stage shift register $SR1_{i-2}$ and an output of the $(i+2)^{th}$ stage shift register $SR1_{i+2}$ and outputs a pre-charge signal PCS according to the outputs of the $(i-2)^{th}$ and $(i+2)^{th}$ stage shift registers $SR1_{i-2}$ and $SR1_{i+2}$. Here, $3 \leq i \leq N-2$. That is, except for the dummy shift registers, the pre-charge unit 310 of each shift register $SR1_i$ receives the scan signals $SS_{i-2}$_L and $SS_{i+2}$_L respectively output by the previous two-stage shift register $SR1_{i-2}$ and the following two-stage shift register $SR1_{i+2}$ and thereby generates the corresponding pre-charge signal PCS.

The dummy shift registers generate the pre-charge signal PCS in response to the start pulse signals STV1_L and STV2_L provided by the timing controller 122. For instance, the pre-charge unit of the first stage shift register $SR1_1$ receives the start pulse signal STV1_L and the scan signal $SS_3$_L output by the third stage shift register $SR1_3$, the pre-charge unit of the second stage shift register $SR1_2$ receives the start pulse signal STV2_L and the scan signal $SS_4$_L output by the fourth stage shift register $SR1_4$, the pre-charge unit of the $(N-1)^{th}$ stage shift register $SR1_{N-1}$ receives the start pulse signal STV1_L and the scan signal $SS_{N-3}$_L output by the $(N-3)^{th}$ stage shift register $SR1_{N-3}$, and the pre-charge unit of the $N^{th}$ stage shift register $SR1_N$ receives the start pulse signal STV2_L and the scan signal $SS_{N-2}$_L output by the $(N-2)^{th}$ stage shift register $SR1_{N-2}$.

In addition, the pre-charge unit of each of the shift registers $SR1_i$ to $SR1_N$ receives the forward input signal FW and the backward input signal BW, such that the bidirectional shift register device 112_L drives the pixels in odd rows in the display area AA in the forward scan order or the reverse scan order according to the forward input signal FW and the backward input signal BW. For instance, the bidirectional shift register device 112_L may drive the pixels in odd rows in the forward scan order (from the first row to the last row) according to the enabled forward input signal FW and the disabled backward input signal BW and may drive the pixels in odd rows in the reverse scan order (from the last row to the first row) according to the disabled forward input signal FW and the enabled backward input signal BW.

The pull-up unit 320 is coupled to the pre-charge unit 310, receives the pre-charge signal PCS and a predetermined clock signal PCK, and outputs a scan signal $SS_i$_L according to the pre-charge signal PCS and the predetermined clock signal PCK. The pull-down unit 330 is coupled to the pre-charge unit 310 and the pull-up unit 320 and includes a first discharge unit 332 and a second discharge unit 334. The first discharge unit 332 receives the pre-charge signal PCS and a first level signal VPWL1 and thereby determines whether to pull the scan signal $SS_i$_L down to a reference voltage potential Vss (including but not limited to a negative voltage). The second discharge unit 334 receives the pre-charge signal PCS and a second level signal VPWL2 and thereby determines whether to keep the scan signal $SS_i$_L to the reference voltage potential Vss. Here, a phase of the first level signal VPWL1 and a phase of the second level signal VPWL2 are inverse to each other. The level of the first level signal VPWL1 allows the first discharge unit 332 to be driven in a normal manner to discharge. Note that the actual voltage level may be determined according to the actual circuit operation, which should not be construed as a limitation to the invention. Similarly, the level of the second level signal VPWL2 allows the second discharge unit 334 to be driven in a normal manner to discharge. Note that the actual voltage level may be determined according to the actual circuit operation, which should not be construed as a limitation to the invention.

To be specific, the timing controller 122 sequentially provides different clock signals CLK1_L to CLK4_L as the corresponding predetermined clock signals PCK to each of the shift registers $SR1_1$ to $SR1_N$, such that the shift registers $SR1_1$ to $SR1_N$ are able to drive the pixels in odd rows in the display area AA in the forward scan order or the reverse scan order. Here, the waveforms of the clock signals CLK1_L to CLK4_L and the start pulse signals STV1_L and STV2_L provided by the timing controller 122 may be changed in response to the pixel-driving manner in the forward scan order or the reverse scan order, which is clearly shown in the following schematic signal timing diagram.

Figure 3B:
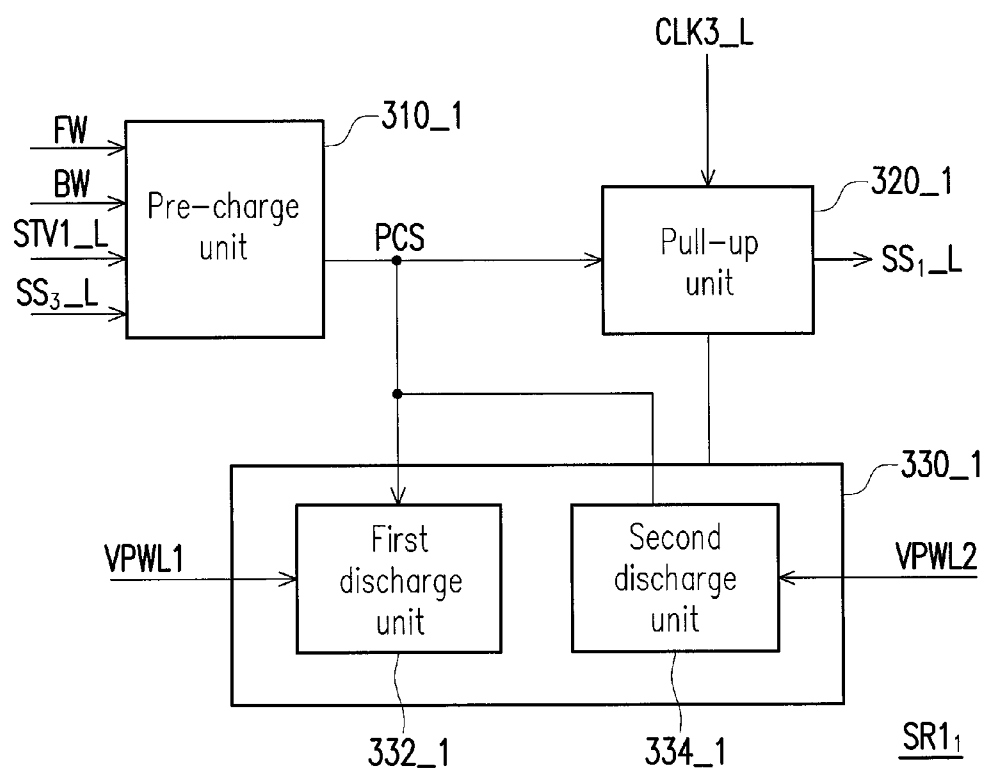
FIG. 3B to FIG. 3E are schematic views illustrating operations of circuits of the first to the fourth shift registers according to the embodiment depicted in FIG. 3A.

In case of the pixel-driving manner in the forward scan order, please refer to FIG. 3B to FIG. 3E which are schematic views illustrating operations of circuits of the first to the fourth shift registers according to the embodiment depicted in FIG. 3A. With reference to FIG. 3B, if the bidirectional shift register device 112_L scans the display area AA in the forward scan order, the pre-charge unit 310_1 of the exemplary first stage shift register $SR1_1$(i=1) receives the start pulse signal STV1_L and the scan signal $SS_3$_L, and the predetermined clock signal PCK received by the pull-up unit 320_1 of the first stage shift register $SR1_1$ is the clock signal CLK3_L.

Figure 3C:
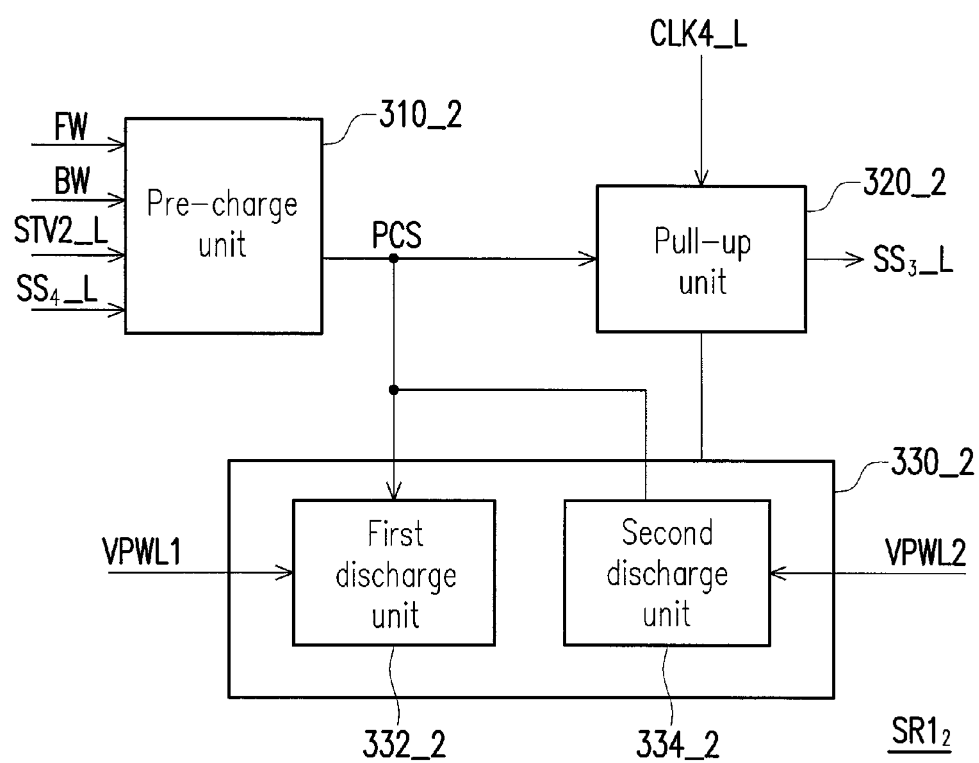

With reference to FIG. 3C, if the bidirectional shift register device 112_L scans the display area AA in the forward scan order, the pre-charge unit 310_2 of the exemplary second stage shift register $SR1_2$(i=2) receives the start pulse signal STV2_L and the scan signal $SS_4$_L, and the predetermined clock signal PCK received by the pull-up unit 320_2 of the second stage shift register $SR1_2$ is the clock signal CLK4_L.

Figure 3D:
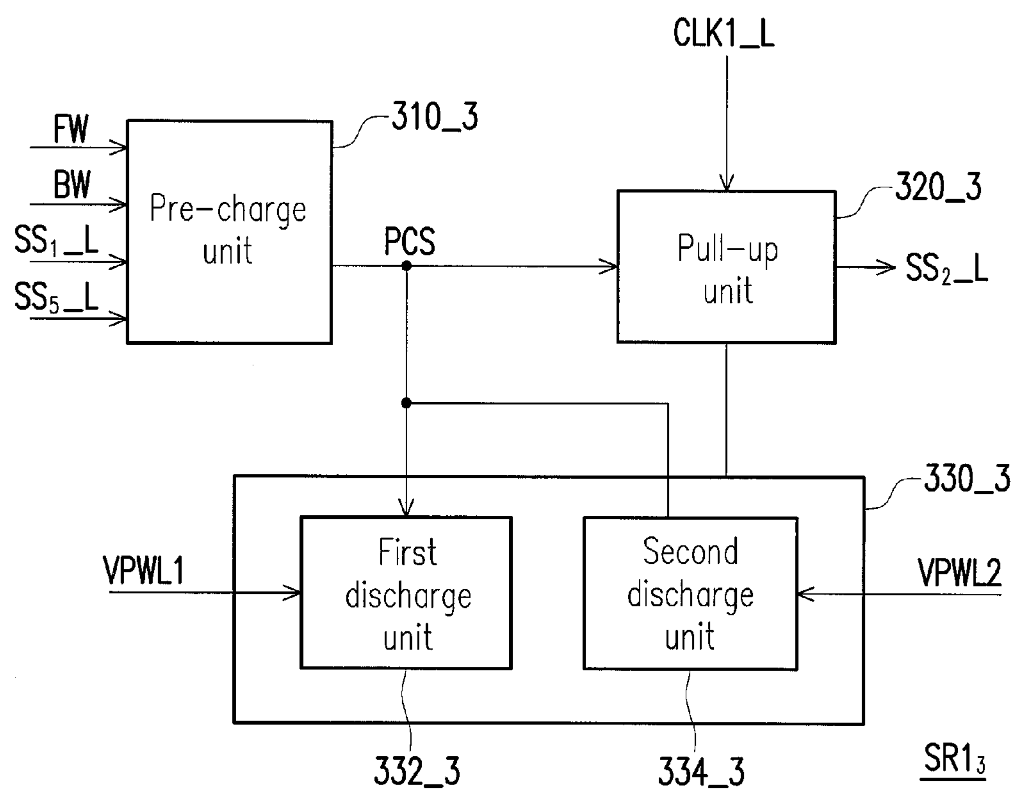

With reference to FIG. 3D, if the bidirectional shift register device 112_L scans the display area AA in the forward scan order, the pre-charge unit 310_3 of the exemplary third stage shift register $SR1_3$(i=3) receives the scan signals $SS_1$_L and $SS_5$_L, and the predetermined clock signal PCK received by the pull-up unit 320_3 of the third stage shift register $SR1_3$ is the clock signal CLK1_L.

Figure 3E:
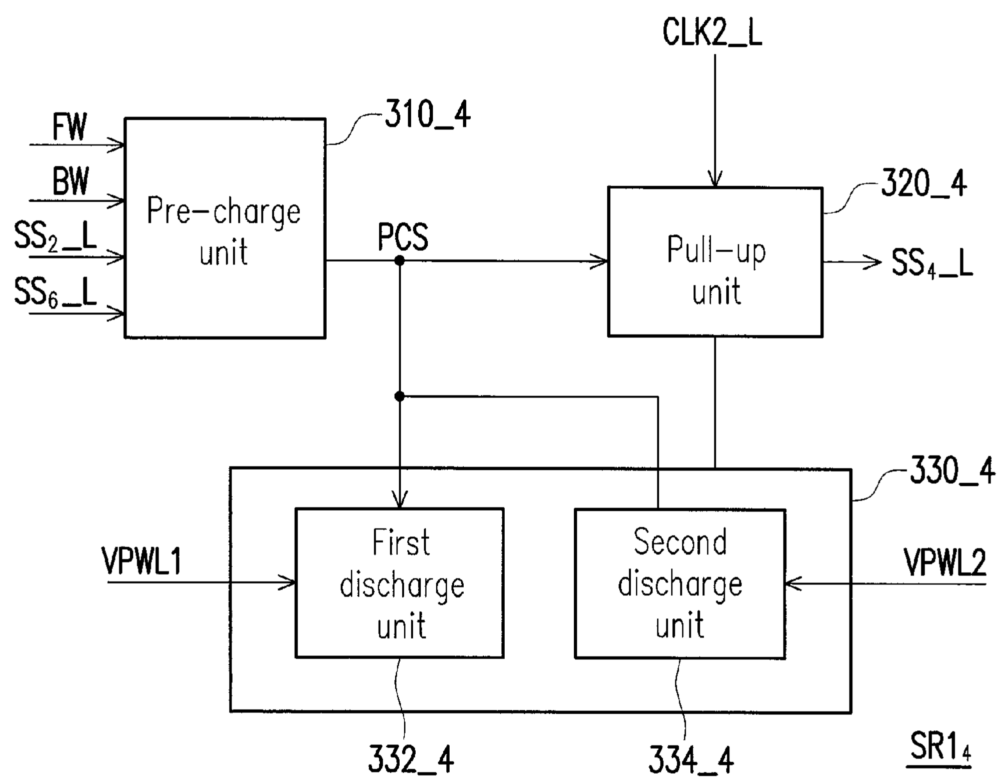

With reference to FIG. 3E, if the bidirectional shift register device 112_L scans the display area AA in the forward scan order, the pre-charge unit 310_4 of the exemplary fourth stage shift register $SR1_4$(i=4) receives the scan signals $SS_2$_L and $SS_6$_L, and the predetermined clock signal PCK received by the pull-up unit 320_4 of the fourth stage shift register $SR1_4$ is the clock signal CLK2_L.

In light of the foregoing, the predetermined clock signal PCK of the $(4k-3)^{th}$ stage shift register $SR1_i$ is the clock signal CLK3_L; here, i=4k−3, and k is a positive integer. Besides, the predetermined clock signal PCK of the $(4k-2)^{th}$ stage shift register $SR1_i$ (i=4k−2) is the clock signal CLK4_L. The predetermined clock signal PCK of the $(4k-1)^{th}$ stage shift register $SR1_i$ (i=4k−1) is the clock signal CLK1_L. The predetermined clock signal PCK of the $4k^{th}$ stage shift register $SR1_i$ (i=4k) is the clock signal CLK2_L. That is, the predetermined clock signals PCK of each of the shift registers $SR1_1$ to $SR1_N$ are sequentially the clock signals CLK3_L, CLK4_L, CLK1_L and CLK2_L.

Figure 4:
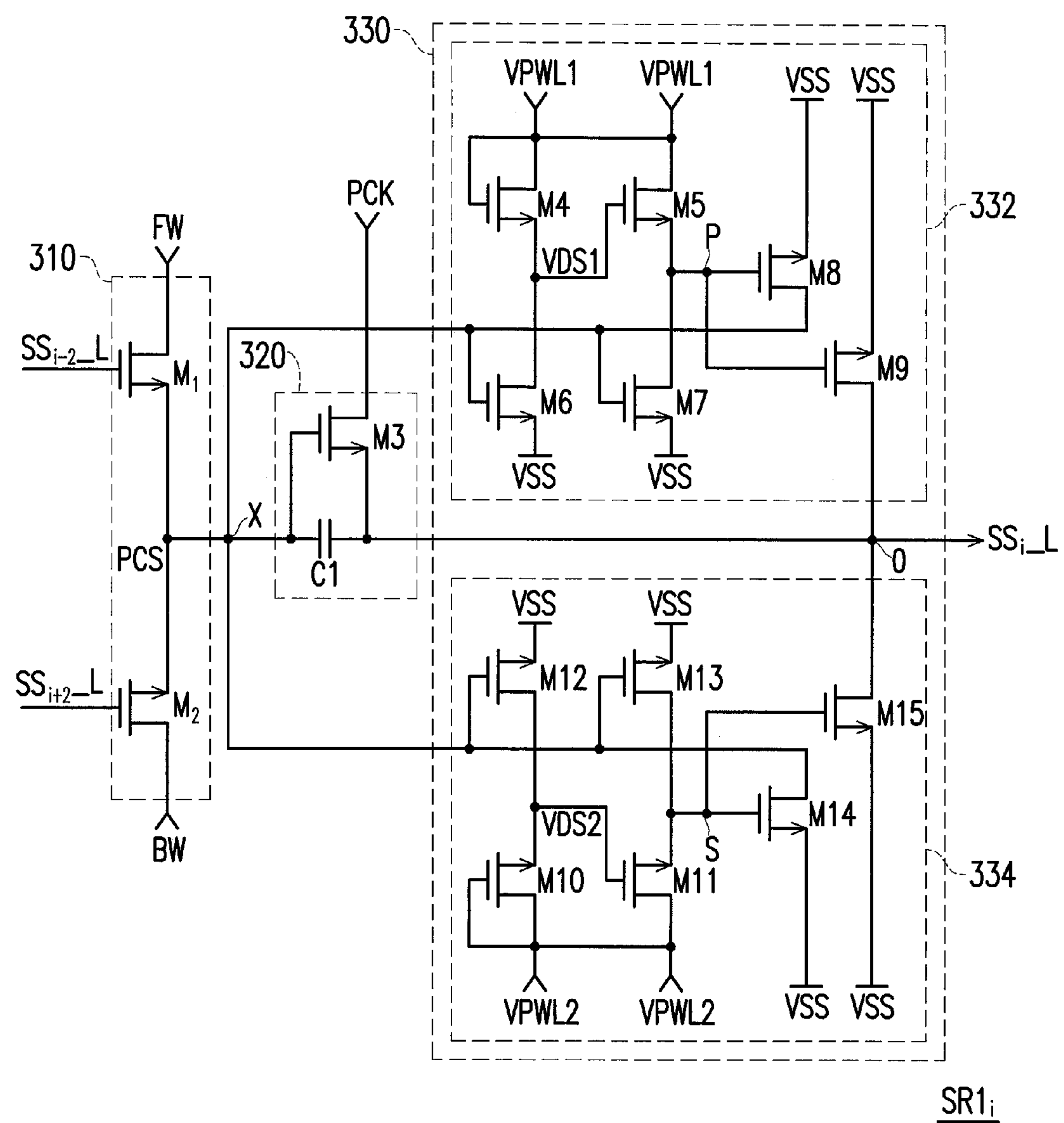
FIG. 4 is a schematic view illustrating circuits of the shift registers according to the embodiment depicted in FIG. 3A.

FIG. 4 is a schematic view illustrating circuits of the shift registers according to the embodiment depicted in FIG. 3A. With reference to FIG. 4, the pre-charge unit 310 includes transistors M1 and M2, the pull-up unit 320 includes a transistor M3 and a capacitor C1, the first discharge unit 332 of the pull-down unit 330 includes transistors M4 to M9, and the second discharge unit 334 of the pull-down unit 330 includes transistors M10 to M15. Each of the transistors M1 to M15 described in the present embodiment is an n-type transistor, for instance, while the invention is not limited thereto.

In the pre-charge unit 310 of the $i^{th}$ stage shift register $SR1_i$, a gate of the transistor M1 receives the scan signal $SS_{i-2}$_L output by the $(i-2)^{th}$ stage shift register $SR1_{i-2}$, and a drain of the transistor M1 receives the forward input signal FW. A gate of the transistor M2 receives the scan signal $SS_{i+2}$_L output by the $(i+2)^{th}$ stage shift register $SR1_{i+2}$, a source of the transistor M2 is coupled to a source of the transistor M1, and a drain of the transistor M2 receives the backward input signal BW. Here, the source of the transistor M2 and the source of the transistor ml are together coupled to a node X to output the pre-charge signal PCS.

In the pull-up unit 320 of the $i^{th}$ stage shift register $SR1_i$, a gate of transistor M3 receives the pre-charge signal PCS from the node X, a drain of the transistor M3 receives the predetermined clock signal PCK, and a source of the transistor M3 outputs the scan signal $SS_i$_L. A first terminal of the capacitor C1 is coupled to the gate of the transistor M3 and the node X, and a second terminal of the capacitor C1 is coupled to the source of the transistor M3.

In the first discharge unit 332 of the $i^{th}$ stage shift register $SR1_i$, a gate of transistor M4 is coupled to a drain of the transistor M4 to receive the first level signal VPWL1, and a source of the transistor M4 outputs the first voltage-dividing signal VDS1. A gate of the transistor M5 receives the first voltage-dividing signal VDS1, and a drain of the transistor M5 is coupled to the drain of the transistor M4 and receives the first level signal VPWL1. A gate of the transistor M6 is coupled to the source of the transistor M1 and the source of the transistor M2 to receive the pre-charge signal PCS, a drain of the transistor M6 is coupled to the source of the transistor M4, and a source of the transistor M6 is coupled to the reference voltage potential Vss. A gate of the transistor M7 is coupled to the source of the transistor M1 and the source of the transistor M2 to receive the pre-charge signal PCS, a drain of the transistor M7 is coupled to the source of the transistor M5, and a source of the transistor M7 is coupled to the reference voltage potential Vss. A gate of the transistor M8 is coupled to the source of the transistor M5 and the source of the transistor M7, a drain of the transistor M8 is coupled to the source of the transistor M1 and the source of the transistor M2, and a source of the transistor M8 is coupled to the reference voltage potential Vss. A gate of the transistor M9 is coupled to the gate of the transistor M8, a drain of the transistor M9 is coupled to the source of the transistor M3, and a source of the transistor M9 is coupled to the reference voltage potential Vss.

In the second discharge unit 334 of the $i^{th}$ stage shift register $SR1_i$, a gate of transistor M10 is coupled to a drain of the transistor M10 to receive the second level signal VPWL2, and a source of the transistor M10 outputs the second voltage-dividing signal VDS2. A gate of the transistor M11 receives the second voltage-dividing signal VDS2, and a drain of the transistor M11 is coupled to the drain of the transistor M10 and receives the second level signal VPWL2. A gate of the transistor M12 is coupled to the source of the transistor M1 and the source of the transistor M2 to receive the pre-charge signal PCS, a drain of the transistor M12 is coupled to the source of the transistor M10, and a source of the transistor M12 is coupled to the reference voltage potential Vss. A gate of the transistor M13 is coupled to the source of the transistor M1 and the source of the transistor M2 to receive the pre-charge signal PCS, a drain of the transistor M13 is coupled to the source of the transistor M11, and a source of the transistor M13 is coupled to the reference voltage potential Vss. A gate of the transistor M14 is coupled to the source of the transistor M11 and the source of the transistor M13, a drain of the transistor M14 is coupled to the source of the transistor M1 and the source of the transistor M2, and a source of the transistor M14 is coupled to the reference voltage potential Vss. A gate of the transistor M15 is coupled to the gate of the transistor M14, a drain of the transistor M15 is coupled to the source of the transistor M3, and a source of the transistor M15 is coupled to the reference voltage potential Vss.

Figure 5A:
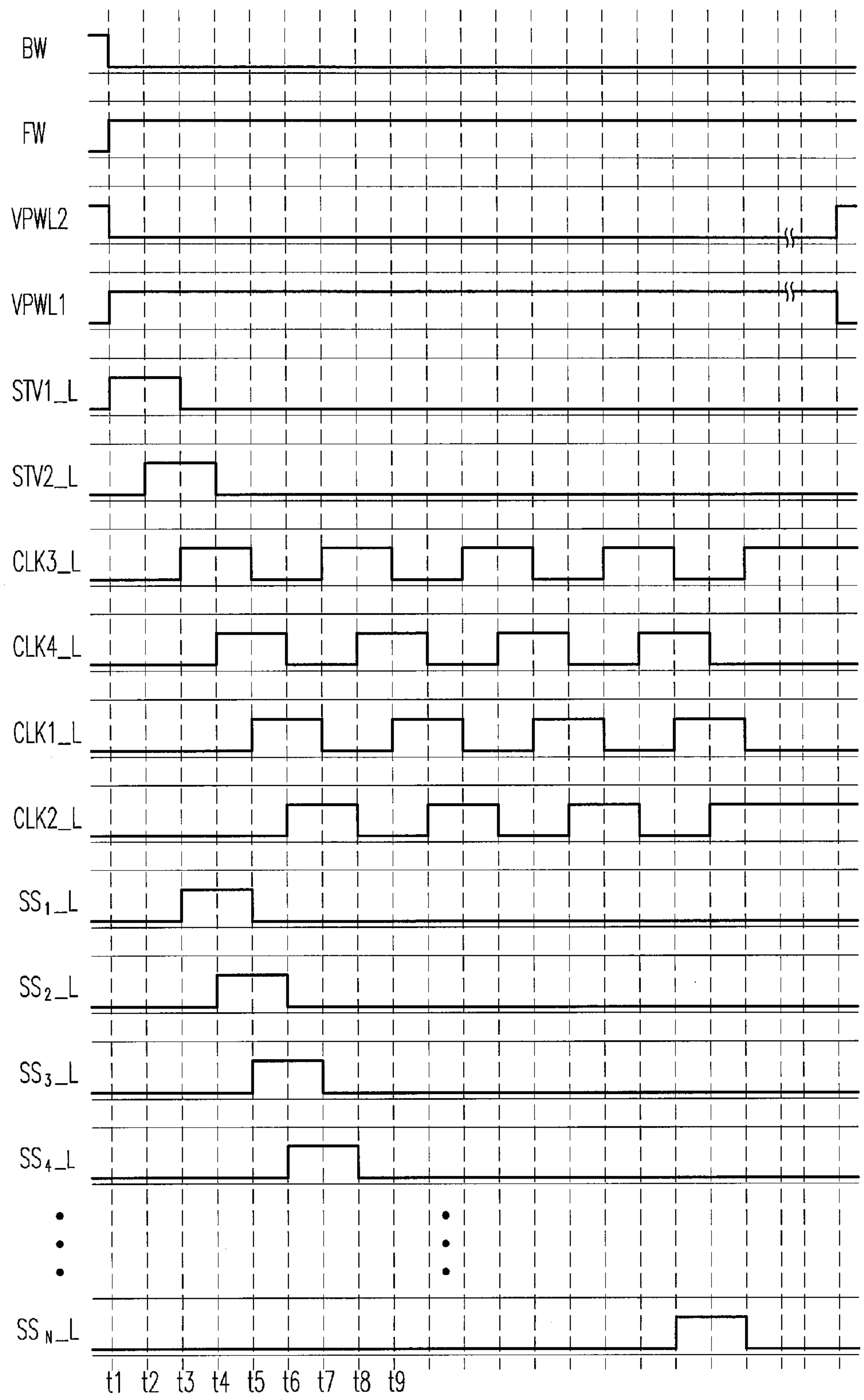
FIG. 5A and FIG. 5B are schematic signal timing diagrams of a bidirectional shift register device according to an embodiment of the invention.

FIG. 5A is a schematic signal timing diagram illustrating that the bidirectional shift register device 112_L scans the pixels in odd rows in the display area AA in the forward scan order, and the operational principle of the shift register $SR1_i$ shown in FIG. 4 may be clearly explained with reference to FIG. 5A.

As shown in FIG. 5A, in case of the pixel-driving manner in the forward scan order, the shift register $SR1_i$ receives the high-level forward scan signal FW and the low-level reverse scan signal BW and receives the first level signal VPWL1 and the second level signal VPWL2. Here, the phase of the first level signal VPWL1 and the phase of the second level signal VPWL2 are inverse to each other. Besides, the timing controller 122 provides the clock signals CLK3_L, CLK4_L, CLK1_L, and CLK2_L which have the specific duty cycle, and there are phase differences among the clock signals CLK3_L, CLK4_L, CLK1_L, and CLK2_L. In the present embodiment, the duty cycle of each of the clock signals CLK3_L, CLK4_L, CLK1_L, and CLK2_L is 50%, for instance, and each of the clock signals CLK3_L, CLK4_L, CLK1_L, and CLK2_L which differs in phase by 90 degrees one after another is generated by the timing controller 122 in the order of CLK3_L→CLK4_L→CLK1_L→CLK2_L; that is, the enabling time of each of the clock signals CLK3_L, CLK4_L, CLK1_L, and CLK2_L is respectively overlapped by 50%, which should however not be construed as a limitation to the invention. Here, the enabling time refers to the time at which the signal is raised to the high level, i.e., the width of each pulse. For instance, the phase of the clock signal CLK4_L lags behind the phase of the clock signal CLK3_L by 90 degrees, the phase of the clock signal CLK1_L lags behind the phase of the clock signal CLK4_L by 90 degrees, and the phase of the clock signal CLK2_L lags behind the phase of the clock signal CLK1_L by 90 degrees.

Besides, in the present embodiment, the enabling time of the first pulse of the clock signal CLK3_L within one frame period is later than the enabling time of the start pulse signal STV2_L and is overlapped with the enabling time of the start pulse signal STV2_L by 50%. The phase of the start pulse signal STV2_L lags behind the phase of the start pulse signal STV1_L, and the enabling time of the start pulse signal STV2_L is overlapped with the enabling time of the start pulse signal STV1_L by 50%.

With reference to FIG. 2A, FIG. 4, and FIG. 5A, in the exemplary first shift register $SR1_1$, during the frame period from t1 to t3, the transistor M1 in the pre-charge unit 310 is turned on in response to the enabled start pulse signal STV1_L, and the transistor M2 in the pre-charge unit 310 is turned off in response to the disabled scan signal $SS_3$_L. Thereby, the pre-charge unit 310 outputs the corresponding pre-charge signal PCS to pre-charge the node X. During said frame period, the pull-up unit 320 receives the disabled clock signal CLK3_L, and therefore the scan signal $SS_1$_L is at the reference voltage potential Vss no matter whether the transistor M3 is turned on by the pre-charge signal PCS.

During the frame period from t3 to t5, the transistors M1 and M2 in the pre-charge unit 310 are turned off respectively in response to the disabled start pulse signal STV1_L and the disabled scan signal $SS_3$_L. The pull-up unit 320 receives the enabled clock signal CLK3_L; during said frame period, the node X is pulled up due to the coupling effects between the drain and the gate of the transistor M3, and thereby the transistor M3 is turned on and outputs the high-level scan signal $SS_1$_L. In another aspect, the transistors M6 and M7 in the first discharge unit 332 are turned on respectively in response to the pre-charge signal PCS received by the gates of the transistors M6 and M7.

Since the transistors M6 and M7 are turned on by a high-level voltage of the node X, the first voltage-dividing signal VDS1 is pulled down to the low level and turns off the transistor M5. Hence, the potential of the node P is pulled down to a low level because the transistor M5 is turned off; thereby, the transistors M8 and M9 are turned off and do not discharge the nodes O and X. As a result, the first discharge unit 332 does not affect the output of the scan signal $SS_1$_L during the frame period from t3 to t5, and the scan signal $SS_1$_L remains at the high level during the frame period from t3 to t5.

Similarly, the transistors M12 and M13 in the second discharge unit 332 are turned on respectively in response to the pre-charge signal PCS received by the gates of the transistors M12 and M13. Since the transistors M12 and M13 are turned on by the high-level voltage of the node X, the second voltage-dividing signal VDS2 is pulled down to the low level and turns off the transistor M11. The potential of the node S is pulled down to a low level because the transistor M11 is turned off; thereby, the transistors M14 and M15 are turned off and do not discharge the nodes O and X. As a result, the second discharge unit 334 does not affect the output of the scan signal $SS_1$_L during the frame period from t3 to t5, and the scan signal $SS_1$_L remains at the high level during the frame period from t3 to t5.

During the frame period from t5 to t7, the transistor M1 in the pre-charge unit 310 is turned off in response to the disabled start pulse signal STV1_L, and the transistor M2 in the pre-charge unit 310 is turned on in response to the enabled scan signal $SS_3$_L; hence, during said frame period, the pre-charge unit 310 discharges the node X by means of the transistor M2 which is turned on. Thereby, the transistors M6 and M7 are turned off because of the low-level node X. Owing to the first level signal VPWL1, the first voltage-dividing signal VDS1 is generated between the transistors M4 and M6, and the transistor M5 is turned on by means of the first voltage-dividing signal VDS1. Since the transistor M5 is turned on, the voltage at the node P may be pulled up to a level close to the potential of the first level signal VPWL1, and the voltage at the node P further turns on the transistors M8 and M9. In response to the voltage at the node P, the transistors M8 and M9 in the first discharge unit 332 are turned on, so as to respectively discharge the nodes X and O. Therefore, the scan signal $SS_1$_L may be rapidly pulled down to the reference voltage potential Vss at the timing t5 and remains at the reference voltage potential Vss during the frame period from t5 to t7.

During the next frame period from t5 to t7, the transistor M1 in the pre-charge unit 310 is turned off in response to the disabled start pulse signal STV1_L, and the transistor M2 in the pre-charge unit 310 is turned on in response to the enabled scan signal $SS_3$_L; hence, during said frame period, the pre-charge unit 310 discharges the node X by means of the transistor M2 which is turned on. Thereby, the transistors M12 and M13 in the second discharge unit are turned off because of the low voltage level of the node X. The second level signal VPWL2 (at the low level during the previous frame period) is raised to a high level, and thereby the second voltage-dividing signal VDS2 is generated between the transistors M10 and M12, The transistor M11 is turned on by means of the second voltage-dividing signal VDS2. Since the transistor M11 is turned on, the voltage at the node S may be pulled up to a level close to the potential of the second level signal VPWL2, and the voltage at the node S further turns on the transistors M14 and M15. In response to the voltage at the node S, the transistors M14 and M15 in the second discharge unit 334 are turned on, so as to respectively discharge the nodes X and O. Therefore, the scan signal $SS_1$_L may be rapidly pulled down to the reference voltage potential Vss at the same timing t5 in the next frame period and remains at the reference voltage potential Vss during the frame period from t5 to t7. During the consecutive frame periods, the first and second discharge units 332 and 334 discharge the node X in turns, so as to pull down the scan signal $SS_1$_L and keep the scan signal $SS_1$_L to the reference voltage potential Vss. Hence, the transistor M3 in the pull-up unit 320 is less likely to be turned on due to erroneous actions, and erroneous actions of the shift register $SR1_1$ can also be prevented.

During the next frame period from t7 to t9, the transistors M1 and M2 in the pre-charge unit 310 are turned off respectively in response to the disabled start pulse signal STV1_L and the disabled scan signal $SS_3$_L. The pull-up unit 320 still receives the enabled clock signal CLK3_L. However, since the node X is discharged and is pulled to the reference voltage potential Vss during the previous frame period, the transistors M6 and M7 in the first discharge unit 332 are not turned on during the current frame period from t7 to t9, and the node O remains at the reference voltage potential Vss in the frame period from t7 to t9. In addition, the transistors M12 and M12 in the second discharge unit 334 are not turned on during the next frame period, such that the second discharge unit 334 controls the node O to remain at the reference voltage potential Vss during the frame period from t7 to t9.

In the previous exemplary embodiment, during the consecutive frame periods, the first and second discharge units 332 and 334 respectively discharge the nodes X and O in turns, so as to pull down the scan signal $SS_1$_L and keep the scan signal $SS_1$_L to the reference voltage potential Vss; however, the invention is not limited thereto. In another embodiment, the first and second discharge units 332 and 334 may simultaneously discharge the nodes X and O in the same frame period by means of the actual input voltage of the first and second level signals VPWL1 and VPWL2, so as to pull down the scan signal $SS_1$_L and keep the scan signal $SS_1$_L to the reference voltage potential Vss. The simultaneous operation of the first and second discharge units 332 and 334 ensures the stability of the scan signal $SS_1$_L output by the shift register SR1, and the possibility of outputting the unexpected scan signal by the shift register SR1 may be lessened.

The following operations of the shift register $SR1_i$ in the subsequent frame periods (after the timing t9) may be referred to as those provided above during the frame periods from t5 to t7 and from t7 to t9 and thus will not be further described. Besides, the operational principle of the $i^{th}$ stage shift register $SR1_i$ is explained in the previous exemplary embodiment; since the operational principles of other shift registers are similar to that of the $i^{th}$ stage shift register $SR1_i$, no further explanation will be provided hereinafter.

Given the structure depicted in FIG. 4, the first and second discharge units 332 and 334 are able to control the shift registers $SR1_1$ to $SR1_N$ by means of a small number of signals (i.e., the pre-charge signal PCS and the first/second level signal VPWL1/VPWL2); compared to the conventional shift register, the shift register provided herein may be controlled in a much simple manner.

From another perspective, in case of the pixel-driving manner in the reverse scan order, the shift registers $SR1_1$ to $SR1_N$ receive the high-level backward input signal BW and the low-level forward input signal FW, and the shift register $SR1_i$ receives the first level signal VPWL1 and the second level signal VPWL2. Here, the phase of the first level signal VPWL1 and the phase of the second level signal VPWL2 are inverse to each other. Here, the waveforms of the clock signals CLK1_L to CLK4_L and the start pulse signals STV1_L and STV2_L provided by the timing controller 122 are exemplarily shown in FIG. 6A. The difference in the embodiments respectively depicted in FIG. 6A and FIG. 5A lies in that each of the clock signals CLK1_L to CLK4_L which differs in phase by 90 degrees one after another is generated by the timing controller 122 in the order of CLK2_L→CLK1_L→CLK4_L→CLK3_L (in case of the pixel-driving manner in the forward scan order, the timing controller 122 generates the clock signals in the order of CLK3_L→CLK4_L→CLK1_L→CLK2_L). Besides, in the present embodiment, the enabling time of the first pulse of the clock signal CLK2_L within one frame period is earlier than the enabling time of the start pulse signal STV1_L and is overlapped with the enabling time of the start pulse signal STV1_L by 50%.

Specifically, in case of the pixel-driving manner in the reverse scan order, the predetermined clock signal PCK of the exemplary shift registers $SR_N$, $SR_{N-1}$, $SR_{N-2}$, and $SR_{N-3}$ is the clock signals CLK2_L, CLK1_L, CLK4_L, and CLK3_L sequentially. Note that the order of the stages of the shift registers $SR1_1$ to ~$SR1_N$ is defined by the forward scan order (i.e., from top to bottom), which should however not be construed as a limitation to the invention. That is, in case of the pixel-driving manner in the reverse scan order, the order of the stages of the shift registers $SR1_1$ to ~$SR1_N$ may be defined by the reverse scan order (i.e., from bottom to top). For instance, the shift registers $SR1_N$, $SR1_{N-1}$, . . . , and $SR1_1$ shown in FIG. 2A may sequentially defined as the first stage, the second stage, . . . , and the $N^{th}$ stage shift register.

Figure 5B:
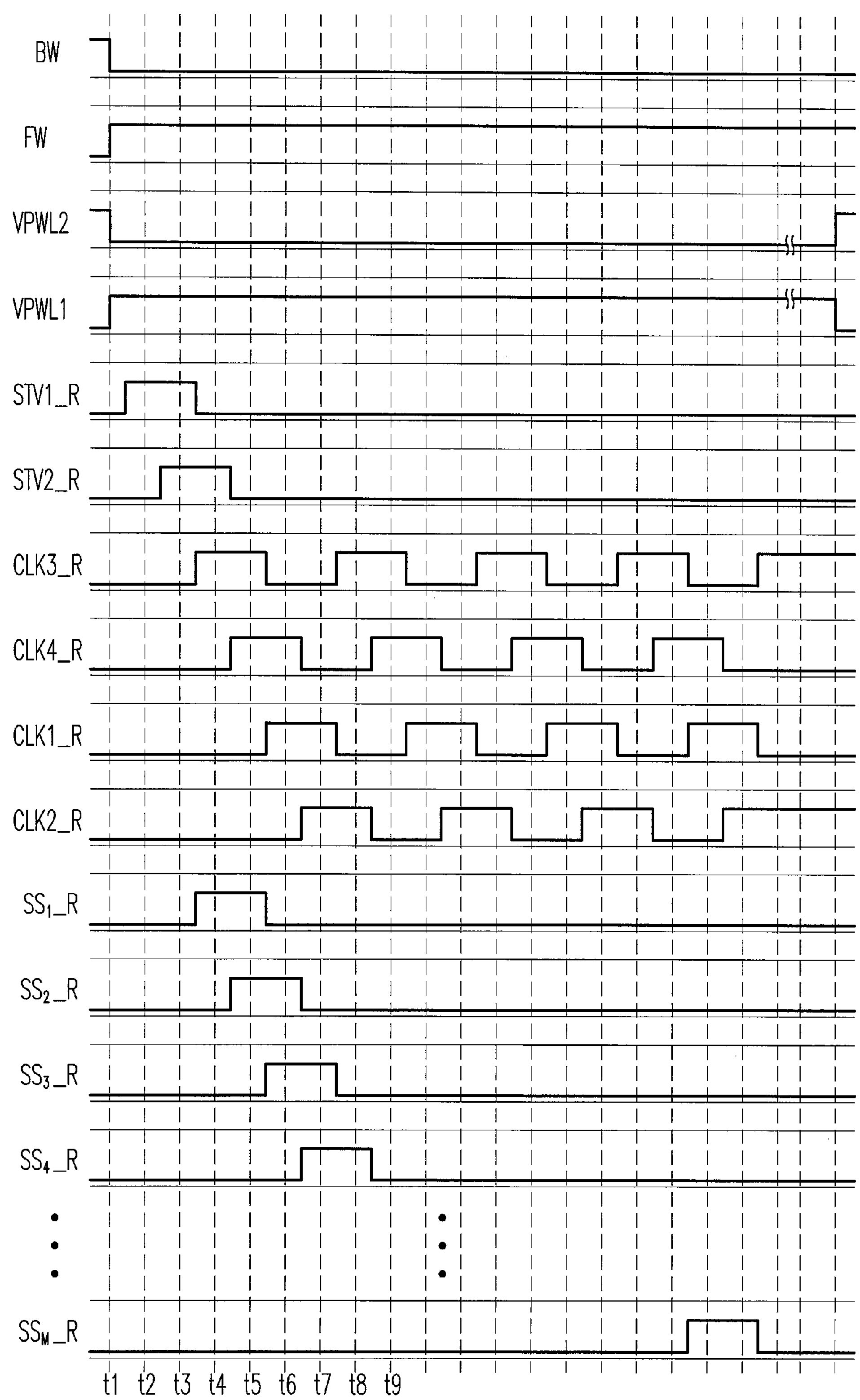
Figure 6A:
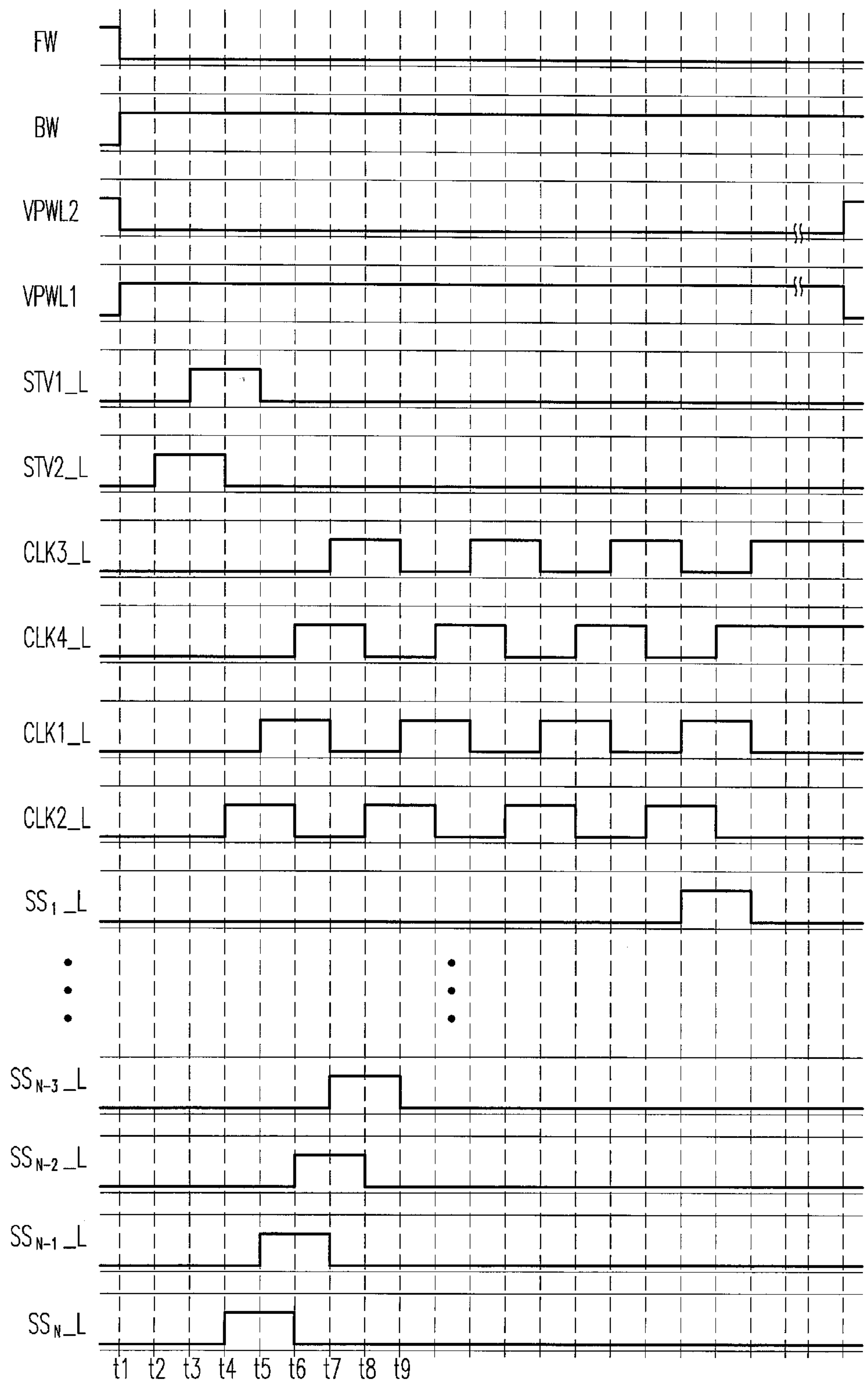
FIG. 6A and FIG. 6B are schematic signal timing diagrams of a bidirectional shift register device according to another embodiment of the invention.
Figure 6B:
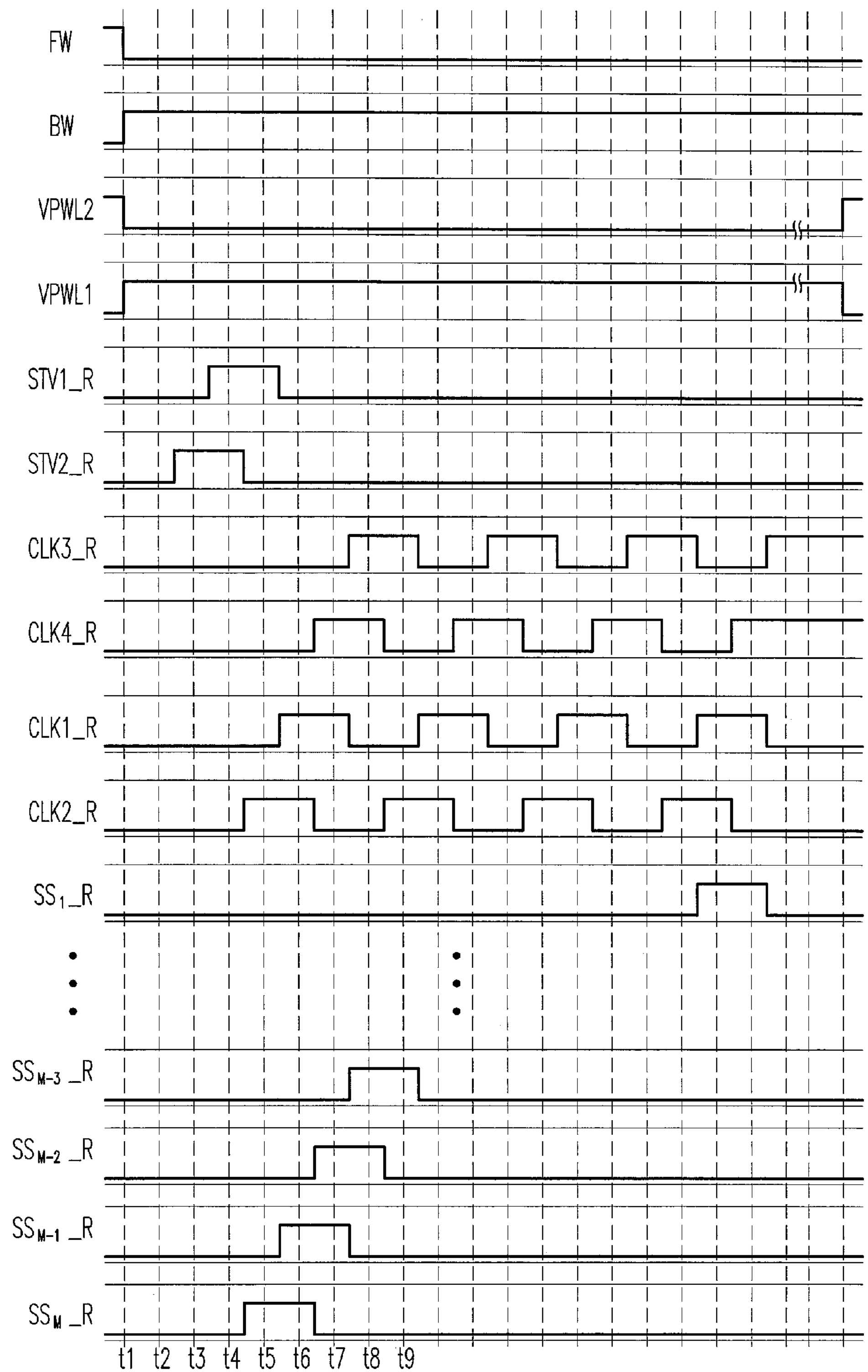

FIG. 5B and FIG. 6B are schematic signal timing diagrams of the bidirectional shift register device 112_R in case of the pixel-driving manner in the forward scan order and in the reverse scan order, respectively. With reference to FIG. 2B and FIG. 5B together, in the present embodiment, the structures and the operational principles of the bidirectional shift register device 112_R and its shift registers $SR2_1$ to $SR2_M$ are the same as those of the bidirectional shift register device 112_L. The difference between the bidirectional shift register devices 112_R and 112_L lies in that the pixels in the even rows in the display area AA are sequentially driven by the bidirectional shift register devices 112_R according to the start pulse signals STV1_R and STV2_R and the clock signals CLK1_R to CLK4_R.

To be specific, as shown in FIG. 5A and FIG. 5B, in case of the pixel-driving manner in the forward scan order, the start pulse signals STV1_R and STV2_R respectively correspond to the start pulse signals STV1_L and STV2_L, and the difference therebetween lies in that the phases of the start pulse signals STV1_R and STV2_R respectively lag behind the phases of the start pulse signals STV1_L and STV2_L by 45 degrees. That is, the enabling time of the start pulse signal STV1_L is overlapped with the enabling time of the start pulse signal STV1_R by 75%, and the enabling time of the start pulse signal STV2_L is also overlapped with the enabling time of the start pulse signal STV2_R by 75%. Similarly, the clock signals CLK1_R to CLK4_R respectively correspond to the clock signals CLK1_L to CLK4_L, and the difference therebetween lies in that the phases of the clock signals CLK1_R to CLK4_R respectively lag behind the phases of the clock signals CLK1_L to CLK4_L by 45 degrees. That is, the enabling time of the clock signals CLK1_L to CLK4_L is respectively overlapped with the enabling time of the corresponding clock signals CLK1_R to CLK4_R by 75%. In view of the difference in the signal timing, the bidirectional shift register device 112_R may sequentially generate the scan signals $SS_1$_R to $SS_M$_R to drive the pixels in even rows columns, and the scan signals $SS_1$_R to $SS_M$_R and the scan signals $SS_1$_L to $SS_M$_L differ in phase to certain extent. Thereby, adjacent pixels in each row may be sequentially turned on at certain time intervals (e.g., half the frame period from t1 to t2).

Besides, from the descriptions provided in the embodiments shown in FIG. 2A to FIG. 6A, people skilled in the art, after referring to FIG. 6A, should be able to learn the operational principle of the bidirectional shift register device 112_R and those of the shift registers SR$\mathbf{2}_1$ to SR$\mathbf{2}_M$ in case of the pixel-driving manner in the reverse scan order, and therefore no further explanation is provided hereinafter.

To sum up, an embodiment of the invention provides an LCD and its bidirectional shift register device. The bidirectional shift register device is capable of discharging nodes by means of the voltage-dividing signals generated in the discharge units, so as to stably control the level of the scan signal output by each shift register and further prevent the significant difference in the width of each transistor in the shift registers. As a result, if the shift registers described in the embodiment of the invention are applied, small components bearing large current load are less likely to be damaged, and the reliability of the bidirectional shift register device can be further improved. Moreover, since there is no significant difference in the width of each transistor in the shift registers described herein, the circuit layout may be more flexible, and the circuit layout area of the shift register device may be further reduced.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A bidirectional shift register device, for a display panel having a plurality of pixels arranged in an array, wherein the array has a plurality of odd rows and a plurality of even rows, wherein the number of the odd rows and the number of the even rows are positive integers, comprising:

N stage shift registers connected in series as $1^{st}$ to $N^{th}$ stage shift registers if the bidirectional shift register device is coupled to pixels arranged in the odd rows of the array, wherein the $3^{rd}$ to $(N-2)^{th}$ stage shift registers are configured to turn on pixels in each of the odd rows of the array respectively, wherein the $1^{st}$, $2^{nd}$, $(N-1)^{th}$ and $N^{th}$ stage first shift registers are dummy stage first shift registers among the N stage first shift register, wherein N is the number of the odd rows plus 4; or M stage shift registers connected in series as $1^{st}$ to $M^{th}$ stage shift registers if the bidirectional shift register device is coupled to pixels arranged in the even rows of the array, wherein the $3^{rd}$ to $(M-2)^{th}$ stage shift registers of the M stage shift registers are configured to turn on pixels in each of the even rows of the array respectively, wherein the $1^{st}$, $2^{nd}$, $(M-1)^{th}$ and $M^{th}$ stage second shift registers are dummy stage second shift registers among the M stage second shift register, wherein M is the number of the even rows plus 4, wherein an $i^{th}$ stage shift register among the $3^{rd}$ to $(N-2)^{th}$ stage shift registers or a $j^{th}$ stage shift register among the $3^{rd}$ to $(M-2)^{th}$ stage shift registers comprises:

a pre-charge unit receiving an output from an $(i-2)^{th}$ stage shift register and an output from an $(i+2)^{th}$ stage shift register if the pre-charge unit is corresponding to the $i^{th}$ stage shift register, or an output from an $(j-2)^{th}$ stage shift register and an output from an $(j+2)^{th}$ stage shift register if the pre-charge unit is corresponding to the $j^{th}$ stage shift register and outputting a pre-charge signal according to the two received outputs;

a pull-up unit coupled to the pre-charge unit, the pull-up unit receiving the pre-charge signal and a predetermined clock signal and outputting a scan signal according to the pre-charge signal and the predetermined clock signal; and a pull-down unit coupled to the pre-charge unit and the pull-up unit, the pull-down unit comprising:

a first discharge unit receiving the pre-charge signal and a first level signal and determining whether to pull the scan signal down to a reference voltage potential according to the pre-charge signal and a first voltage-dividing signal associated with the first level signal; and a second discharge unit receiving the pre-charge signal and a second level signal and determining whether to pull the scan signal down to the reference voltage potential according to the pre-charge signal and a second voltage-dividing signal associated with the second level signal.

2. The bidirectional shift register device as recited in claim 1, wherein the pre-charge unit of each of the N/M stage shift registers further receives a forward input signal and a backward input signal, the bidirectional shift register device sequentially outputs the scan signals in a first order or a second order according to the forward input signal and the backward input signal, and the second order is different from the first order.

3. The bidirectional shift register device as recited in claim 2, wherein the pre-charge unit of the $i^{th}/j^{th}$ stage shift register comprises:

a first transistor, a gate of the first transistor receiving the scan signal output by the $(i-2)^{th}/(j-2)^{th}$ stage shift register, a first source/drain of the first transistor receiving the forward input signal, a second source/drain of the first transistor outputting the pre-charge signal; and a second transistor, a gate of the second transistor receiving the scan signal output by the $(i+2)^{th}/(j+2)^{th}$ stage shift register, a first source/drain of the second transistor being coupled to the second source/drain of the first transistor, a second source/drain of the second transistor receiving the backward input signal.

4. The bidirectional shift register device as recited in claim 3, wherein the pull-up unit of the $i^{th}/j^{th}$ stage shift register comprises:

a third transistor, a gate of the third transistor receiving the pre-charge signal, a first source/drain of the third transistor receiving the predetermined clock signal, a second source/drain of the third transistor outputting the scan signal; and a first capacitor, a first terminal of the first capacitor being coupled to the gate of the third transistor, a second terminal of the first capacitor being coupled to the second source/drain of the third transistor.

5. The bidirectional shift register device as recited in claim 4, wherein the first discharge unit of the $i^{th}/j^{th}$ stage shift register comprises:

a fourth transistor, a gate of the fourth transistor being coupled to a first source/drain of the fourth transistor to receive the first level signal, a second source/drain of the fourth transistor outputting the first voltage-dividing signal;

a fifth transistor, a gate of the fifth transistor receiving the first voltage-dividing signal, a first source/drain of the fifth transistor being coupled to the first source/drain of the fourth transistor and receiving the first level signal;

a sixth transistor, a gate of the sixth transistor being coupled to the second source/drain of the first transistor and the first source/drain of the second transistor to receive the pre-charge signal, a first source/drain of the sixth transistor being coupled to the second source/drain of the fourth transistor, a second source/drain of the sixth transistor being coupled to the reference voltage potential;

a seventh transistor, a gate of the seventh transistor being coupled to the second source/drain of the first transistor and the first source/drain of the second transistor to receive the pre-charge signal, a first source/drain of the seventh transistor being coupled to a second source/drain of the fifth transistor, a second source/drain of the seventh transistor being coupled to the reference voltage potential;

an eighth transistor, a gate of the eighth transistor being coupled to the second source/drain of the fifth transistor and the first source/drain of the seventh transistor, a first source/drain of the eighth transistor being coupled to the second source/drain of the first transistor and the first source/drain of the second transistor, a second source/drain of the eighth transistor being coupled to the reference voltage potential; and a ninth transistor, a gate of the ninth transistor being coupled to the gate of the eighth transistor, a first source/drain of the ninth transistor being coupled to the second source/drain of the third transistor, a second source/drain of the ninth transistor being coupled to the reference voltage potential, wherein the second discharge unit of the $i^{th}/j^{th}$ stage shift register comprises:

a tenth transistor, a gate of the tenth transistor being coupled to a first source/drain of the tenth transistor to receive the second level signal, a second source/drain of the tenth transistor outputting the second voltage-dividing signal;

an eleventh transistor, a gate of the eleventh transistor receiving the second voltage-dividing signal, a first source/drain of the eleventh transistor being coupled to the first source/drain of the tenth transistor and receiving the second level signal;

a twelfth transistor, a gate of the twelfth transistor being coupled to the second source/drain of the first transistor and the first source/drain of the second transistor to receive the pre-charge signal, a first source/drain of the twelfth transistor being coupled to the gate of the eleventh transistor, a second source/drain of the twelfth transistor being coupled to the reference voltage potential;

a thirteenth transistor, a gate of the thirteenth transistor being coupled to the second source/drain of the first transistor and the first source/drain of the second transistor to receive the pre-charge signal, a first source/drain of the thirteenth transistor being coupled to a second source/drain of the eleventh transistor, a second source/drain of the thirteenth transistor being coupled to the reference voltage potential;

a fourteenth transistor, a gate of the fourteenth transistor being coupled to the second source/drain of the eleventh transistor and the first source/drain of the thirteenth transistor, a first source/drain of the fourteenth transistor being coupled to the gate of the twelfth transistor, a second source/drain of the fourteenth transistor being coupled to the reference voltage potential; and a fifteenth transistor, a gate of the fifteenth transistor being coupled to the gate of the fourteenth transistor, a first source/drain of the fifteenth transistor being coupled to the second source/drain of the third transistor, a second source/drain of the fifteenth transistor being coupled to the reference voltage potential.

6. A liquid crystal display, comprising:

a liquid crystal display panel comprising a substrate, a plurality of pixels arranged in an array, wherein the array has a plurality of odd rows and a plurality of even rows, wherein the number of the odd rows and the number of the even rows are positive integers, a first bidirectional shift register device, and a second bidirectional shift register device, wherein the pixels, the first bidirectional shift register device, and the second bidirectional shift register device are located on the substrate, the first bidirectional shift register device has N stage first shift registers connected in series as $1^{st}$ to $N^{th}$ stage first shift registers and coupled to the pixels arranged in the odd rows of the array, wherein the $3^{rd}$ to $(N-2)^{th}$ stage first shift registers are configured to turn on pixels in each of the odd rows of the array respectively, wherein N is the number of the odd rows plus 4, and an $i^{th}$ stage first shift register among the $3^{rd}$ to $(N-2)^{th}$ stage first shift registers comprises:

a first pre-charge unit receiving an output of an $(i-2)^{th}$ stage first shift register and an output of an $(i+2)^{th}$ stage first shift register of the first shift registers and outputting a first pre-charge signal according to the received outputs of the $(i-2)^{th}$ and $(i+2)^{th}$ stage first shift registers;

a first pull-up unit coupled to the first pre-charge unit, the first pull-up unit receiving the first pre-charge signal and a first predetermined clock signal and outputting a first scan signal according to the first pre-charge signal and the first predetermined clock signal; and a first pull-down unit coupled to the first pre-charge unit and the first pull-up unit, the first pull-down unit comprising:

a first discharge unit receiving the first pre-charge signal and a first level signal and determining whether to pull the first scan signal down to a reference voltage potential according to the first pre-charge signal and a first voltage-dividing signal associated with the first level signal; and a second discharge unit receiving the first pre-charge signal and a second level signal and determining whether to pull the first scan signal down to the reference voltage potential according to the first pre-charge signal and a second voltage-dividing signal associated with the second level signal, wherein a phase of the first level signal and a phase of the second level signal are inverse to each other, wherein the second bidirectional shift register device has M stage second shift registers connected in series as $1^{st}$ to $M^{th}$ stage second shift registers and coupled to pixels arranged in the even rows of the array, wherein the $3^{rd}$ to $(M-2)^{th}$ stage second shift registers of the M stage second shift registers are configured to turn on pixels in each of the even rows of the array respectively, wherein M is the number of the even rows plus 4, and a $j^{th}$ stage second shift register among the $3^{rd}$ to $(M-2)^{th}$ stage second shift registers comprises:

a second pre-charge unit receiving an output of a $(j-2)^{th}$ stage second shift register and an output of a $(j+2)^{th}$ stage second shift register of the second shift registers and outputting a second pre-charge signal according to the received outputs of the $(j-2)^{th}$ and $(j+2)^{th}$ stage second shift registers;

a second pull-up unit coupled to the second pre-charge unit, the second pull-up unit receiving the second pre-charge signal and a second predetermined clock signal and outputting a second scan signal according to the second pre-charge signal and the second predetermined clock signal; and a second pull-down unit coupled to the second pre-charge unit and the second pull-up unit, the second pull-down unit comprising:

a third discharge unit receiving the second pre-charge signal and a third level signal and determining whether to pull the second scan signal down to the reference voltage potential according to the second pre-charge signal and a third voltage-dividing signal associated with the third level signal; and a fourth discharge unit receiving the second pre-charge signal and a fourth level signal and determining whether to pull the second scan signal down to the reference voltage potential according to the second pre-charge signal and a fourth voltage-dividing signal associated with the fourth level signal, wherein a phase of the third level signal and a phase of the fourth level signal are inverse to each other;

a driver circuit coupled to the liquid crystal display panel for driving the liquid crystal display panel to display an image, the driver circuit providing a plurality of predetermined clock signals as the first predetermined clock signal and the second predetermined clock signal; and a backlight module for providing a light source required by the liquid crystal display panel.

7. The liquid crystal display as recited in claim 6, wherein the first pre-charge unit of each of the first shift registers and the second pre-charge unit of each of the second shift registers further receive a forward input signal and a backward input signal, the first bidirectional shift register device and the second the bidirectional shift register device sequentially output the first scan signals and the second scan signals in a first order or a second order according to the forward input signal and the backward input signal, and the second order is different from the first order.

8. The liquid crystal display as recited in claim 7, wherein the $i^{th}$ stage first shift register further comprises:

a first transistor, a gate of the first transistor receiving the first scan signal output by the $(i-2)^{th}$ stage first shift register, a first source/drain of the first transistor receiving the forward input signal, a second source/drain of the first transistor outputting the first pre-charge signal;

a second transistor, a gate of the second transistor receiving the first scan signal output by the $(i+2)^{th}$ stage first shift register, a first source/drain of the second transistor being coupled to the second source/drain of the first transistor, a second source/drain of the second transistor receiving the backward input signal, wherein the first transistor and the second transistor together constitute the first pre-charge unit;

a third transistor, a gate of the third transistor receiving the first pre-charge signal, a first source/drain of the third transistor receiving the first predetermined clock signal, a second source/drain of the third transistor outputting the first scan signal;

a first capacitor, a first terminal of the first capacitor being coupled to the gate of the third transistor, a second terminal of the first capacitor being coupled to the second source/drain of the third transistor, wherein the third transistor and the first capacitor together constitute the first pull-up unit;

a fourth transistor, a gate of the fourth transistor being coupled to a first source/drain of the fourth transistor to receive the first level signal, a second source/drain of the fourth transistor outputting the first voltage-dividing signal;

a fifth transistor, a gate of the fifth transistor receiving the first voltage-dividing signal, a first source/drain of the fifth transistor being coupled to the first source/drain of the fourth transistor and receiving the first level signal;

a sixth transistor, a gate of the sixth transistor being coupled to the second source/drain of the first transistor and the first source/drain of the second transistor to receive the first pre-charge signal, a first source/drain of the sixth transistor being coupled to the second source/drain of the fourth transistor, a second source/drain of the sixth transistor being coupled to the reference voltage potential;

a seventh transistor, a gate of the seventh transistor being coupled to the second source/drain of the first transistor and the first source/drain of the second transistor to receive the first pre-charge signal, a first source/drain of the seventh transistor being coupled to the second source/drain of the fifth transistor, a second source/drain of the seventh transistor being coupled to the reference voltage potential;

an eighth transistor, a gate of the eighth transistor being coupled to the second source/drain of the fifth transistor and the first source/drain of the seventh transistor, a first source/drain of the eighth transistor being coupled to the second source/drain of the first transistor and the first source/drain of the second transistor, a second source/drain of the eighth transistor being coupled to the reference voltage potential;

a ninth transistor, a gate of the ninth transistor being coupled to the gate of the eighth transistor, a first source/drain of the ninth transistor being coupled to the second source/drain of the third transistor, a second source/drain of the ninth transistor being coupled to the reference voltage potential, wherein the fourth transistor, the fifth transistor, the sixth transistor, the seventh transistor, the eighth transistor, and the ninth transistor together constitute the first discharge unit;

a tenth transistor, a gate of the tenth transistor being coupled to a first source/drain of the tenth transistor to receive the second level signal, a second source/drain of the tenth transistor outputting the second voltage-dividing signal;

an eleventh transistor, a gate of the eleventh transistor receiving the second voltage-dividing signal, a first source/drain of the eleventh transistor being coupled to the first source/drain of the tenth transistor and receiving the second level signal;

a twelfth transistor, a gate of the twelfth transistor being coupled to the second source/drain of the first transistor and the first source/drain of the second transistor to receive the first pre-charge signal, a first source/drain of the twelfth transistor being coupled to the gate of the eleventh transistor, a second source/drain of the twelfth transistor being coupled to the reference voltage potential;

a thirteenth transistor, a gate of the thirteenth transistor being coupled to the second source/drain of the first transistor and the first source/drain of the second transistor to receive the first pre-charge signal, a first source/drain of the thirteenth transistor being coupled to a second source/drain of the eleventh transistor, a second source/drain of the thirteenth transistor being coupled to the reference voltage potential;

a fourteenth transistor, a gate of the fourteenth transistor being coupled to the second source/drain of the eleventh transistor and the first source/drain of the thirteenth transistor, a first source/drain of the fourteenth transistor being coupled to the gate of the twelfth transistor, a second source/drain of the fourteenth transistor being coupled to the reference voltage potential; and a fifteenth transistor, a gate of the fifteenth transistor being coupled to the gate of the fourteenth transistor, a first source/drain of the fifteenth transistor being coupled to the second source/drain of the third transistor, a second source/drain of the fifteenth transistor being coupled to the reference voltage potential, wherein the tenth transistor, the eleventh transistor, the twelfth transistor, the thirteenth transistor, the fourteenth transistor, and the fifteenth transistor together constitute the second discharge unit.

9. The liquid crystal display as recited in claim 8, wherein the $j^{th}$ stage second shift register further comprises:

a sixteenth transistor, a gate of the sixteenth transistor receiving the second scan signal output by the $(j-2)^{th}$ stage second shift register, a first source/drain of the sixteenth transistor receiving the forward input signal, a second source/drain of the sixteenth transistor outputting the second pre-charge signal;

a seventeenth transistor, a gate of the seventeenth transistor receiving the second scan signal output by the $(j+2)^{th}$ stage second shift register, a first source/drain of the seventeenth transistor being coupled to the second source/drain of the sixteenth transistor, a second source/drain of the seventeenth transistor receiving the backward input signal, wherein the sixteenth transistor and the seventeenth transistor together constitute the second pre-charge unit;

an eighteenth transistor, a gate of the eighteenth transistor receiving the second pre-charge signal, a first source/drain of the eighteenth transistor receiving the second predetermined clock signal, a second source/drain of the eighteenth transistor outputting the second scan signal;

a second capacitor, a first terminal of the second capacitor being coupled to the gate of the eighteenth transistor, a second terminal of the second capacitor being coupled to the second source/drain of the eighteenth transistor, wherein the eighteenth transistor and the second capacitor together constitute the second pull-up unit;

a nineteenth transistor, a gate of the nineteenth transistor being coupled to a first source/drain of the nineteenth transistor to receive the third level signal, a second source/drain of the nineteenth transistor outputting the third voltage-dividing signal;

a twentieth transistor, a gate of the twentieth transistor receiving the third voltage-dividing signal, a first source/drain of the twentieth transistor being coupled to the first source/drain of the nineteenth transistor and receiving the third level signal;

a twenty-first transistor, a gate of the twenty-first transistor being coupled to the second source/drain of the sixteenth transistor and the first source/drain of the seventeenth transistor to receive the second pre-charge signal, a first source/drain of the twenty-first transistor being coupled to the second source/drain of the nineteenth transistor, a second source/drain of the twenty-first transistor being coupled to the reference voltage potential;

a twenty-second transistor, a gate of the twenty-second transistor being coupled to the second source/drain of the sixteenth transistor and the first source/drain of the seventeenth transistor to receive the second pre-charge signal, a first source/drain of the twenty-second transistor being coupled to a second source/drain of the twentieth transistor, a second source/drain of the twenty-second transistor being coupled to the reference voltage potential;

a twenty-third transistor, a gate of the eighth transistor being coupled to the second source/drain of the twentieth transistor and the first source/drain of the twenty-second transistor, a first source/drain of the twenty-third transistor being coupled to the second source/drain of the first transistor and the first source/drain of the seventeenth transistor, a second source/drain of the twenty-third transistor being coupled to the reference voltage potential;

a twenty-fourth transistor, a gate of the twenty-fourth transistor being coupled to the gate of the twenty-third transistor, a first source/drain of the twenty-fourth transistor being coupled to the second source/drain of the eighteenth transistor, a second source/drain of the twenty-fourth transistor being coupled to the reference voltage potential, wherein the nineteenth transistor, the twentieth transistor, the twenty-first transistor, the twenty-second transistor, the twenty-third transistor, and the twenty-fourth transistor together constitute the third discharge unit;

a twenty-fifth transistor, a gate of the twenty-fifth transistor being coupled to a first source/drain of the twenty-fifth transistor to receive the fourth level signal, a second source/drain of the twenty-fifth transistor outputting the fourth voltage-dividing signal;

a twenty-sixth transistor, a gate of the twenty-sixth transistor receiving the fourth voltage-dividing signal, a first source/drain of the twenty-sixth transistor being coupled to the first source/drain of the twenty-fifth transistor and receiving the fourth level signal;

a twenty-seventh transistor, a gate of the twenty-seventh transistor being coupled to the second source/drain of the sixteenth transistor and the first source/drain of the seventeenth transistor to receive the second pre-charge signal, a first source/drain of the twenty-seventh transistor being coupled to the gate of the twenty-sixth transistor, a second source/drain of the twenty-seventh transistor being coupled to the reference voltage potential;

a twenty-eighth transistor, a gate of the twenty-eighth transistor being coupled to the second source/drain of the sixteenth transistor and the first source/drain of the seventeenth transistor to receive the second pre-charge signal, a first source/drain of the twenty-eighth transistor being coupled to a second source/drain of the twenty-sixth transistor, a second source/drain of the twenty-eighth transistor being coupled to the reference voltage potential;

a twenty-ninth transistor, a gate of the twenty-ninth transistor being coupled to the second source/drain of the twenty-seventh transistor and the first source/drain of the twenty-eighth transistor, a first source/drain of the twenty-ninth transistor being coupled to the gate of the twenty-seventh transistor, a second source/drain of the twenty-ninth transistor being coupled to the reference voltage potential; and a thirtieth transistor, a gate of the thirty transistor being coupled to the gate of the twenty-ninth transistor, a first source/drain of the thirty transistor being coupled to the second source/drain of the eighteenth transistor, a second source/drain of the thirtieth transistor being coupled to the reference voltage potential, wherein the twenty-fifth transistor, the twenty-sixth transistor, the twenty-seventh transistor, the twenty-eighth transistor, the twenty-ninth transistor, and the thirtieth transistor together constitute the fourth discharge unit.

10. The liquid crystal display as recited in claim 6, wherein each of a first stage, a second stage, an $(N-1)^{th}$ stage, and an $N^{th}$ stage first shift registers respectively includes the first pre-charge unit, the first pull-up unit, and the first pull-down unit, circuit structures of the first pre-charge unit, the first pull-up unit, and the first pull-down unit are identical to a circuit structure of the $i^{th}$ stage first shift register, each of a first stage, a second stage, an $(M-1)^{th}$ stage, and an $M^{th}$ stage second shift registers respectively includes the second pre-charge unit, the second pull-up unit, and the second pull-down unit, circuit structures of the second pre-charge unit, the second pull-up unit, and the second pull-down unit are identical to a circuit structure of the $j^{th}$ stage second shift register, wherein the $1^{st}$, $2^{nd}$, $(N-1)^{th}$ and $N^{th}$ stage first shift registers are dummy stage first shift registers among the N stage first shift register, and the $1^{st}$, $2^{nd}$, $(M-1)^{th}$ and $M^{th}$ stage second shift registers are dummy stage second shift registers among the M stage second shift register.

* * * * *